(12) United States Patent
Takeda

(10) Patent No.: US 8,724,396 B2
(45) Date of Patent: May 13, 2014

(54) SEMICONDUCTOR MEMORY DEVICE

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/463,355

(22) Filed: May 3, 2012

(65) Prior Publication Data

US 2012/0257442 A1    Oct. 11, 2012

Related U.S. Application Data

(62) Division of application No. 12/910,536, filed on Oct. 22, 2010, now Pat. No. 8,199,594, which is a division of application No. 11/793,080, filed as application No. PCT/JP2005/023544 on Dec. 16, 2005, now abandoned.

(30) Foreign Application Priority Data

Dec. 16, 2004    (JP) .................................. 2004-363946

(51) Int. Cl.
    *G11C 16/06*    (2006.01)

(52) U.S. Cl.
    USPC .................. 365/185.23; 365/205; 365/230.06

(58) Field of Classification Search
    USPC .................................. 365/205, 185.23, 230.06
    See application file for complete search history.

(56) References Cited

U.S. PATENT DOCUMENTS

| | | |
|---|---|---|
| 5,495,444 A | 2/1996 | Okubo et al. |
| 5,973,984 A | 10/1999 | Nagaoka |
| 6,002,635 A | 12/1999 | Matano |
| 6,188,628 B1 | 2/2001 | Tomotani |
| 6,249,468 B1 | 6/2001 | Kan et al. |

(Continued)

FOREIGN PATENT DOCUMENTS

| | | |
|---|---|---|
| JP | 58-211393 | 12/1983 |
| JP | 60-76085 | 4/1985 |

(Continued)

OTHER PUBLICATIONS

A. J. Bhavnagarwala, "The Impact of Intrinsic Device Fluctuations on CMOS SRAM Cell Stability," IEEE Journal of Solid State Circuit, vol. 36, No. 4, Apr. 2001 (Figures 5, 10A, and 10B).

(Continued)

*Primary Examiner* — Anthan Tran
(74) *Attorney, Agent, or Firm* — Scully, Scott, Murphy & Presser PC

(57) ABSTRACT

A semiconductor memory device having a read word line, a write word line and a sub-word driver operable to select the read word line using a main word signal and an inverse read block signal. The sub-word line selects the write word line using the main word signal and an inverse write block signal. The sub-word driver has a first inverter circuit using the main word signal as an input and outputting the read word line. The sub-word driver has a first transistor having a drain, a source, and a gate connected to the read word line, a low potential power source, and the inverse write block signal, respectively, and a second transistor having a drain, a source, and a gate connected to a power source terminal of the first inverter circuit, a power source, and the inverse write block signal, respectively, and can select the write word line.

4 Claims, 26 Drawing Sheets

(56) References Cited

U.S. PATENT DOCUMENTS

| | | | |
|---|---|---|---|
| 6,373,745 B2 | 4/2002 | Saito et al. | |
| 6,965,533 B2 * | 11/2005 | Sakata et al. | 365/202 |
| 7,161,862 B1 | 1/2007 | Lin et al. | |
| 7,301,793 B2 | 11/2007 | Kanehara et al. | |
| 2002/0041531 A1 | 4/2002 | Tanaka et al. | |
| 2003/0002328 A1 | 1/2003 | Yamauchi | |
| 2003/0035331 A1 | 2/2003 | Foss et al. | |
| 2003/0117878 A1 | 6/2003 | Yamada | |
| 2003/0185044 A1 | 10/2003 | Nii | |
| 2004/0228199 A1 * | 11/2004 | Oda | 365/232 |
| 2005/0002225 A1 | 1/2005 | Kanehara et al. | |
| 2007/0201273 A1 | 8/2007 | Chuang et al. | |

FOREIGN PATENT DOCUMENTS

| | | |
|---|---|---|
| JP | 2-21492 | 1/1990 |
| JP | A-H7-29376 | 1/1995 |
| JP | 7-230692 | 8/1995 |
| JP | A-H10-340584 | 12/1998 |
| JP | A-H11-86543 A | 3/1999 |
| JP | A-H11-110969 | 4/1999 |
| JP | 11-328969 | 11/1999 |
| JP | A-2001-312888 | 11/2001 |
| JP | A-2004-63605 | 2/2004 |
| JP | A-2005-25859 | 1/2005 |
| WO | WO 2005/041203 A1 | 5/2005 |

OTHER PUBLICATIONS

H. Sakakibara, "A 750MHz 144Mb Cache DRAM LSI With Speed Scalable Designand Programmable At-speed Function-array BIST," IEEE International Solid State Circuit Conference, 2003 (Figure 1).
International Search Report dated Apr. 25, 2006 from related PCT/JP2005/023544 U. S. Official Action dated Mar. 2, 2011 from related U.S. Appl. No. 11/793,080.
Japanese Official Action dated Apr. 27, 2011 together with an English language translation from JP 2006-550716 U.S. Office Action dated Sep. 15, 2011 from related U.S. Appl. No. 12/910,536.
Office Action dated Oct. 10, 2012 received from the Japanese Patent Office from related Japanese Application No. 2011-136957, together with an English-language translation.
Office Action dated Feb. 20, 2013 received from the Japanese Patent Office from related Japanese Application No. 2011-136974.

* cited by examiner

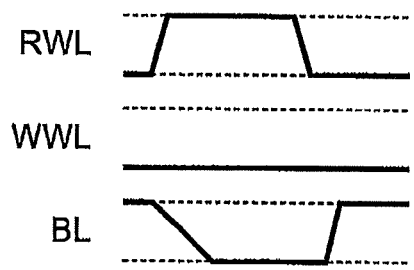
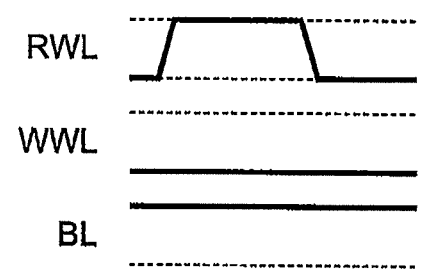
FIG. 14A                    FIG. 14B
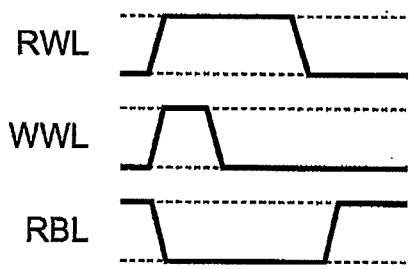
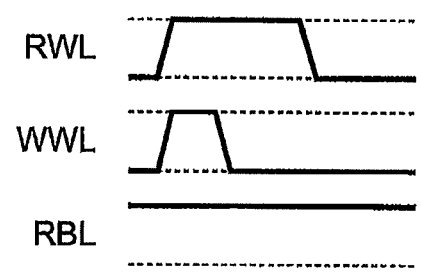
FIG. 14C                    FIG. 14D

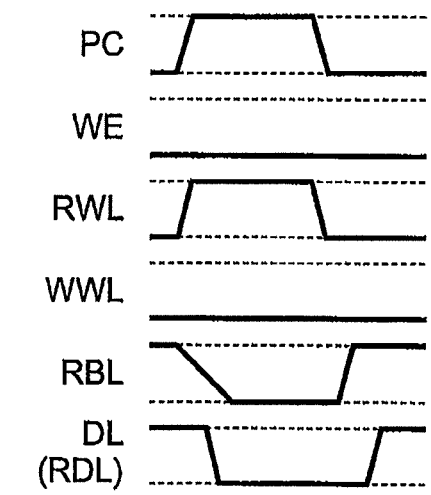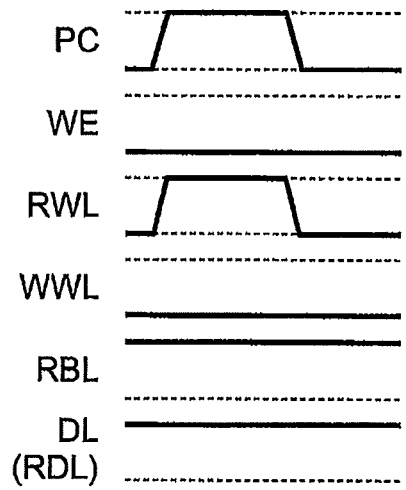
FIG. 20A    FIG. 20B
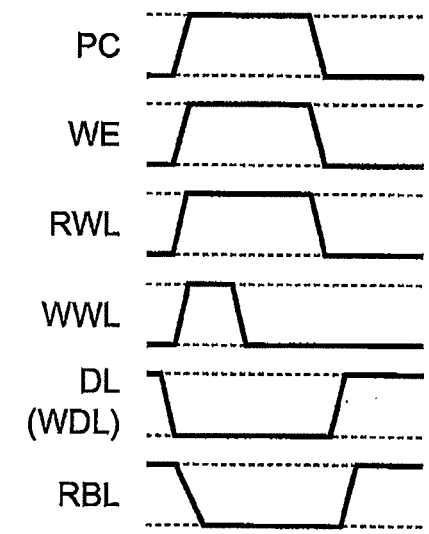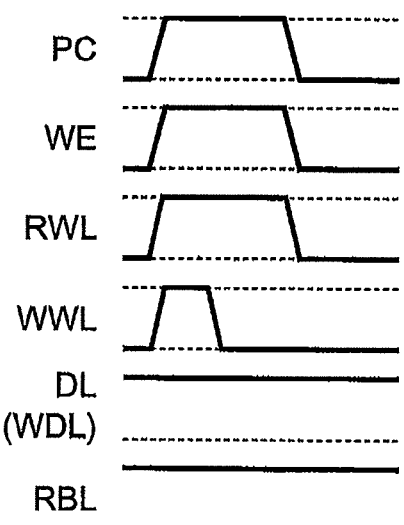
FIG. 20C    FIG. 20D

SWD 11

NR 12

SWD 12

NR 12-1

SWD 21

NR 12-2

SLC 1

SLC 2

WPBC 1

WPBC 2

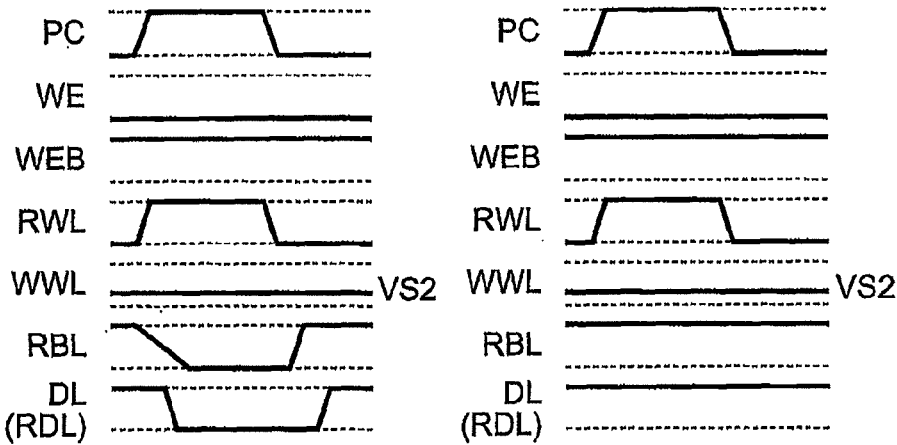
FIG. 31A  FIG. 31B
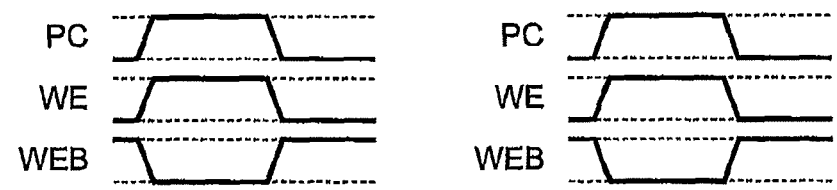
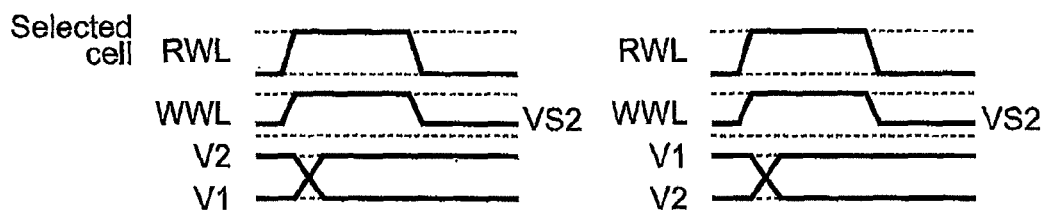
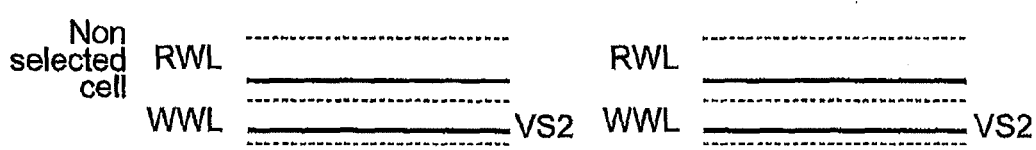
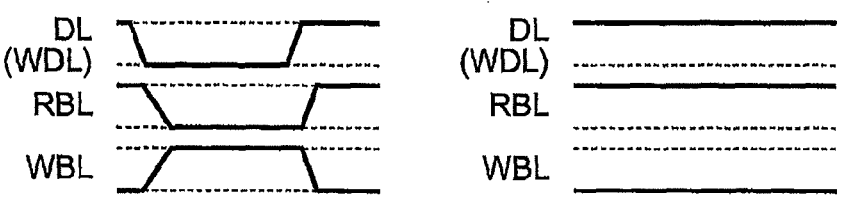
FIG. 31C  FIG. 31D

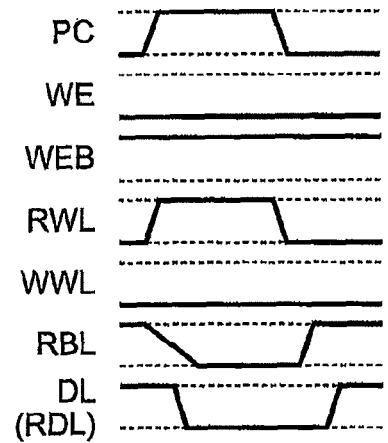
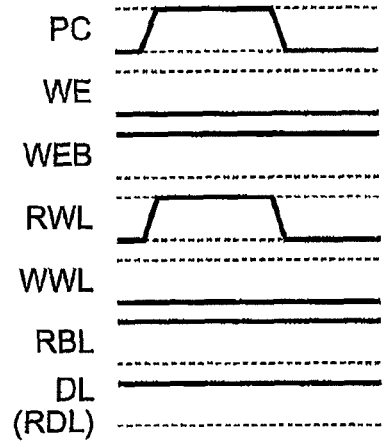
FIG. 32A  FIG. 32B
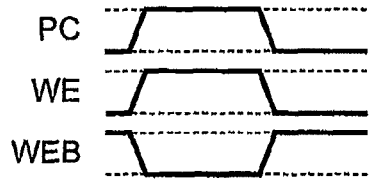
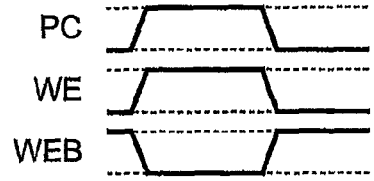
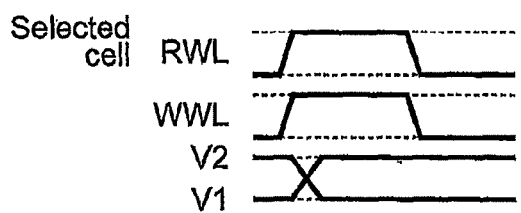
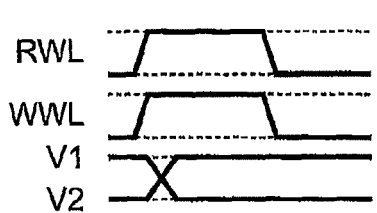
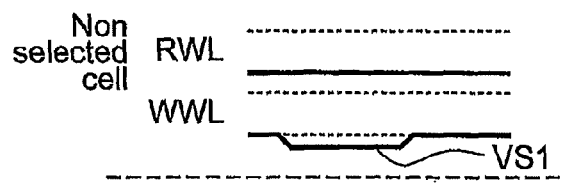
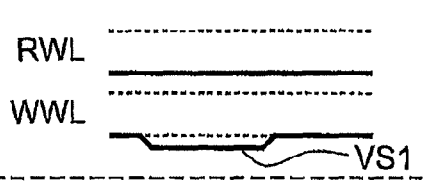
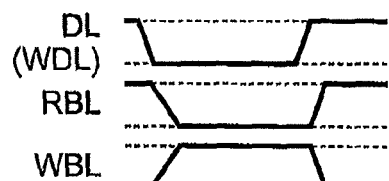
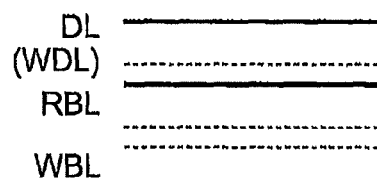
FIG. 32C  FIG. 32D

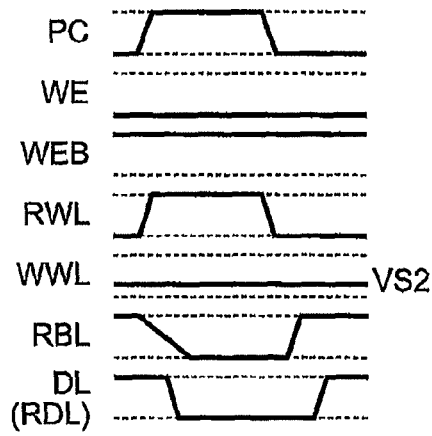
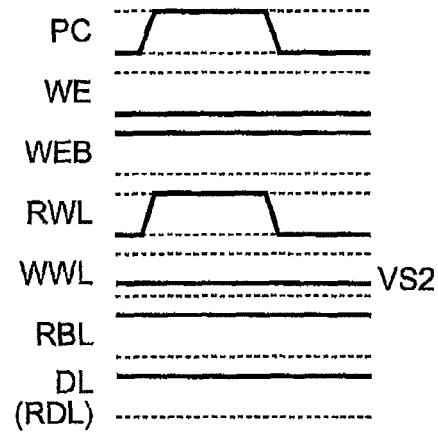
FIG. 33A  FIG. 33B
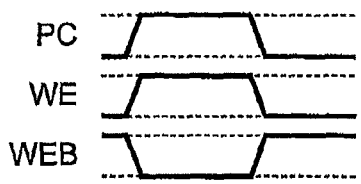
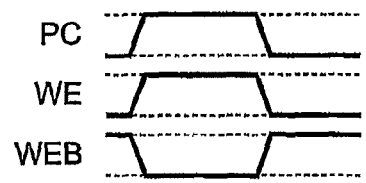
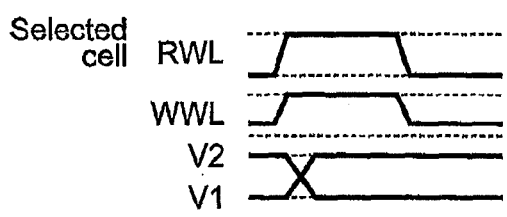
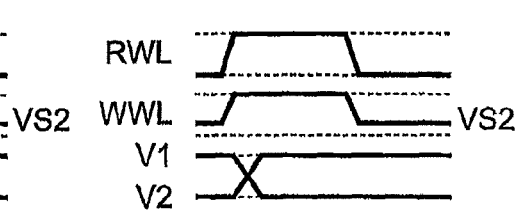
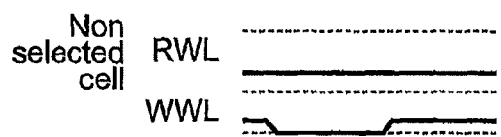
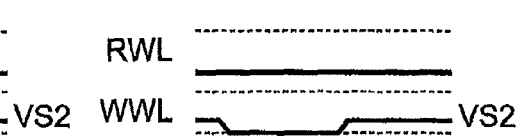
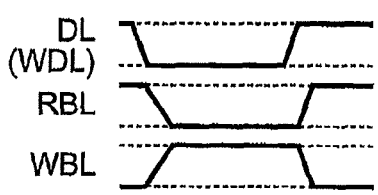
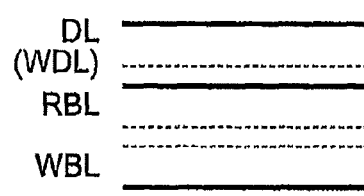
FIG. 33C  FIG. 33D

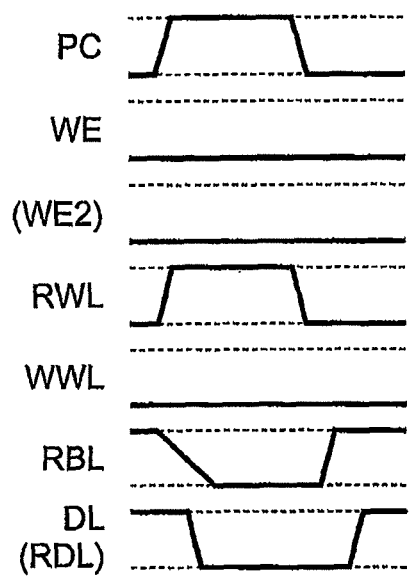
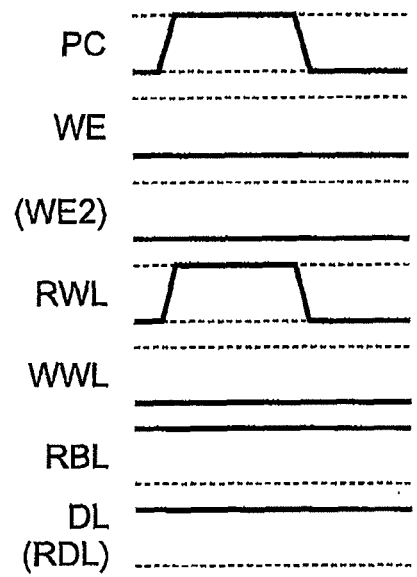
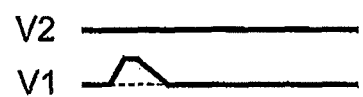
FIG. 36A                FIG. 36B
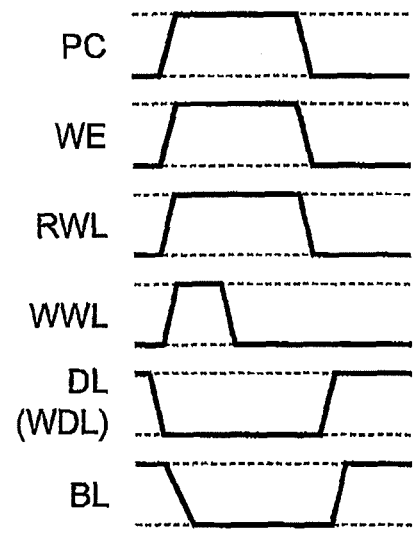
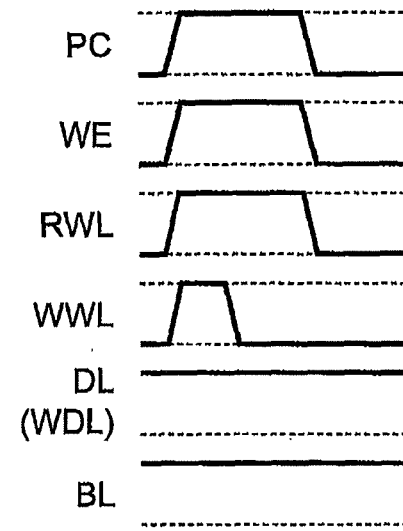
FIG. 36C                FIG. 36D

SEMICONDUCTOR MEMORY DEVICE

CROSS REFERENCE TO RELATED APPLICATION

The present application is a divisional application of U.S. Ser. No. 12/910,536 filed on Oct. 22, 2010, which is a divisional of U.S. Ser. No. 11/793,080 filed on Jun. 15, 2007 which is a '371 filing of PCT/JP2005/023544 filed on Dec. 16, 2005 and claims the benefit of priority of Japanese Patent Application 2004-363946 dated Dec. 16, 2004, the entire contents of each of which are incorporated herein by reference.

TECHNICAL FIELD

The present invention relates to a semiconductor memory device, and more particularly to a semiconductor memory device capable of preventing corruption of stored data in a reading operation with a minimum number of transistors and operating at a very high speed and a very low voltage.

BACKGROUND ART

Recent semiconductor devices have not only been scaled up and speeded up, but also been systematized by incorporating many functions. In order to scale up and speed up semiconductor devices, transistors have been made finer, and operating speeds have been improved while power source voltages have been reduced. Various types of function blocks including a CPU and various types of memory devices are combined with each other for systematization. Those memory devices jointly mounted on system LSIs are similarly required to operate at a high speed and a low power source voltage. For example, a Static Random Access Memory (SRAM), hereinafter abbreviated as SRAM, which is jointly mounted for applications of a cache memory and the like, is similarly required to operate at a high speed and a low power source voltage.

A conventional SRAM will be described with reference to FIG. 1. FIG. 1 shows a conventional SRAM memory cell (hereinafter referred to as an SRAM cell) formed by six transistors. When a word line WL has a low potential, data can be held stably by forming a loop with two CMOS (Complementary Metal Oxide Semiconductor) inverters. Specifically, one of the CMOS inverters uses a storage node V1 as an input and outputs inverse data of data stored in the storage node V1 to a storage node V2. The other of the CMOS inverters uses the storage node V2 as an input and outputs inverse data of data stored in the storage node V2 to the storage node V1.

When the word line WL is accessed and brought into a high potential, access transistors N3 and N4 are brought into conduction so as to read data stored in the storage nodes V1 and V2 into bit lines BLT and BLN, thereby performing a reading operation of the memory. Conversely, data from the bit lines BLT and BLN are written into the storage nodes V1 and V2, thereby performing a writing operation of the memory.

However, there has been a problem that a rate of increase in delay time when a power source voltage Vdd is lowered in a conventional SRAM cell is larger than a rate of increase in delay time of a CMOS inverter circuit. Furthermore, a problem of corruption of stored data also arises when a reading operation is performed at a low power source voltage. FIG. 2 shows the dependence of delay time (normalized delay time r) of an SRAM cell and a CMOS inverter circuit on power source voltages (Vdd). In FIG. 2, a line A represents a delay time of an SRAM cell, and a line B represents a delay time of a CMOS inverter circuit. A rate of increase in delay time of the SRAM cell becomes higher when a power source voltage is lowered. Furthermore, if a reading operation is performed at not more than a certain power source voltage (indicated by "a"), then stored data are corrupted, so that the SRAM cell does not work.

The corruption of stored data in the reading operation will be described with reference to FIGS. 3A to 3C. FIG. 3A shows a waveform of the word line WL, FIG. 3B shows a waveform of the storage nodes in a normal reading operation, and FIG. 3C shows a waveform of the storage nodes when data are corrupted in a reading operation. Here, it is assumed that the storage node V1 has a low potential "0" while the storage node V2 has a high potential "1." As shown in FIG. 3A, when the word line WL is accessed and brought into a high potential, the storage nodes V1 and V2 are brought into conduction with a pair of bit lines BLT and BLN via the access transistors N3 and N4. Thus, the low potential of the storage node V1 is increased by the bit line BLT that has been pre-charged into a high potential.

As shown in FIG. 3B, in a case of storage nodes in a normal cell, a normal reading operation is performed while a low potential "0" of a storage node is slightly increased from the ground potential. However, as shown in FIG. 3C, if the inverter circuit (transistors P2 and N2) has a varied threshold voltage, which is low, then the potential of the storage node V1 reaches the threshold voltage of the inverter circuit (transistors P2 and N2), thereby lowering a high potential "1" of the storage node V2. The reduction in the storage node V2 causes further increase of the potential of the storage node V1. As a result, corruption D of stored data is caused in a reading operation, and the stored data are overwritten with inverse data.

Generally, a Static Noise Margin (SNM) is used as an index for measuring the stability of holding accessed data in an SRAM cell. As shown in FIG. 4, an SRAM cell is separated into two inverters, and DC (direct current) characteristics are calculated for each inverter. When those two DC characteristics are superimposed so that a DC characteristic output of one of the inverters serves as a DC characteristic input of the other inverter, a butterfly curve is drawn. An SNM is defined as one side of a maximum square inscribed in this butterfly curve. When an SNM is 0 mV or more, a normal reading operation is performed as shown in FIG. 3B. When an SNM is 0 mV or less, stored data are overwritten with inverse data in a reading operation as shown in FIG. 3C.

Predictions for the future of the SNM have been made in Reference 1 (A. J. Bhavnagarwala, "The impact of intrinsic device fluctuations on CMOS SRAM cell stability," IEEE Journal of Solid State Circuit, Vol. 36, No. 4, April 2001 (FIGS. 5, 10A, and 10B)). Specifically, when channel lengths of transistors used are made shorter so that they are shifted from 250 nm to 50 nm as shown in FIG. 5, an average of the SNMs is not only decreased, but a deviation of the SNMs is increased. Accordingly, the worst value of the SNMs is considerably lowered. The worst value of the SNMs becomes below "0" in the illustrated example of 50 nm. Accordingly, stored data are corrupted when the word line WL is brought into a high potential in a reading operation.

Meanwhile, an SRAM having a read-only port has been proposed in Reference 2 (H. Sakakibara, "A 750 MHz 144 Mb cache DRAM LSI with speed scalable design and programmable at-speed function-array BIST," IEEE International Solid State Circuit Conference, 2003 (FIG. 1)). In this SRAM, as shown in FIG. 6, a memory cell is formed by eight transistors, and a full swing is taken on a read-only bit line with a cell current of the memory cell. The original purpose of this system is to obtain an improved effect of operating speeds in further developed generations. Furthermore, corruption of stored data in a reading operation, which would become problematic in a conventional SRAM, is not caused because no electric charges flow from the bit line into storage nodes in the cell during the reading operation. Accordingly, an SRAM having this circuit structure can operate not only at a high speed but also with stability even in further developed generations.

In the conventional SRAM cell using six transistors as in Reference 1, the worst value of SNMs is lowered. Accordingly, there is a problem that data will become difficult to be stably held in future. On the other hand, in the SRAM cell having a read-only port as in Reference 2, no corruption of stored data is caused in a reading operation. However, there is a problem that a cell area is increased because the number of transistors is eight and five control signals are required.

DISCLOSURE OF INVENTION

Problems to be Solved by the Invention

As described above, when the conventional SRAM cell formed by six transistors is made finer and configured to operate at a lower voltage, the SNMs thereof are reduced so that the SRAM cell does not operate stably. In order to form a memory cell capable of preventing corruption of stored data in a reading operation, eight transistors and many control signals are required. Accordingly, there is a problem that its component area is increased.

The present invention has been made in order to improve the aforementioned problems. It is, therefore, an object of the present invention to provide a memory cell and a semiconductor memory device which can implement, with a minimum number of transistors and a small component area, a memory capable of preventing corruption of stored data in a reading operation even in a case where an operation at a very high speed or at a very low voltage is required.

Means for Solving the Problems

Effects of the Invention

The SRAM cell is formed by the five transistors. The SRAM cell is formed by an inverter circuit using a storage node V2 as an input and a storage node V1 as an output, a load transistor connected between a power source and the second storage node with using the first storage node as an input, an access transistor N3 connected between a read bit line and the storage node V1, and an access transistor N4 connected between a write bit line and the storage node V2. When the access transistor N4 is controlled by a write word line WWL, it is possible to obtain an effect that data can be held in the memory cell. When the access transistor N4 is used as holding means and writing means, it is possible to obtain a semiconductor device capable of operating at a high speed with a small number of elements.

BRIEF DESCRIPTION OF DRAWINGS

FIG. 14A is a waveform chart explanatory of an operation ("0" reading) in Embodiment 2;

FIG. 14B is a waveform chart explanatory of an operation ("1" reading) in Embodiment 2;

FIG. 14C is a waveform chart explanatory of an operation ("0" writing) in Embodiment 2;

FIG. 14D is a waveform chart explanatory of an operation ("1" writing) in Embodiment 2;

FIG. 20A is a waveform chart explanatory of an operation ("0" reading) in the sense amplifiers SA21 and SA22 shown in FIGS. 18 and 19;

FIG. 20B is a waveform chart explanatory of an operation ("1" reading) in the sense amplifiers SA21 and SA22 shown in FIGS. 18 and 19;

FIG. 20C is a waveform chart explanatory of an operation ("0" writing) in the sense amplifiers SA21 and SA22 shown in FIGS. 18 and 19;

FIG. 20D is a waveform chart explanatory of an operation ("1" writing) in the sense amplifiers SA21 and SA22 shown in FIGS. 18 and 19;

FIG. 31A is a chart explanatory of an operation ("0" reading) in another example of the configuration shown in FIG. 28;

FIG. 31B is a chart explanatory of an operation ("1" reading) in the other example of the configuration shown in FIG. 28;

FIG. 31C is a chart explanatory of an operation ("0" writing) in the other example of the configuration shown in FIG. 28;

FIG. 31D is a chart explanatory of an operation ("1" writing) in the other example of the configuration shown in FIG. 28;

FIG. 32A is a chart explanatory of an operation ("0" reading) in an example of the configuration shown in FIG. 29;

FIG. 32B is a chart explanatory of an operation ("1" reading) in the configuration shown in FIG. 29;

FIG. 32C is a chart explanatory of an operation ("0" writing) in the configuration shown in FIG. 29;

FIG. 32D is a chart explanatory of an operation ("1" writing) in the configuration shown in FIG. 29;

FIG. 33A is a chart explanatory of an operation ("0" reading) in another example of the configuration shown in FIG. 29;

FIG. 33B is a chart explanatory of an operation ("1" reading) in the other example of the configuration shown in FIG. 29;

FIG. 33C is a chart explanatory of an operation ("0" writing) in the other example of the configuration shown in FIG. 29;

FIG. 33D is a chart explanatory of an operation ("1" writing) in the other example of the configuration shown in FIG. 29;

FIG. 36A is a chart explanatory of an operation ("0" reading) in the configuration shown in FIG. 34;

FIG. 36B is a chart explanatory of an operation ("1" reading) in the configuration shown in FIG. 34;

FIG. 36C is a chart explanatory of an operation ("0" writing) in the configuration shown in FIG. 34;

FIG. 36D is a chart explanatory of an operation ("1" writing) in the configuration shown in FIG. 34;

BEST MODE FOR CARRYING OUT THE INVENTION

A memory cell as a semiconductor memory device operable at a low power source voltage and a very high speed according to the present invention, and a sense amplifier and a word driver as peripheral circuits thereof will be described in detail with reference to the drawings.

(Embodiment 1)

Figure 7:
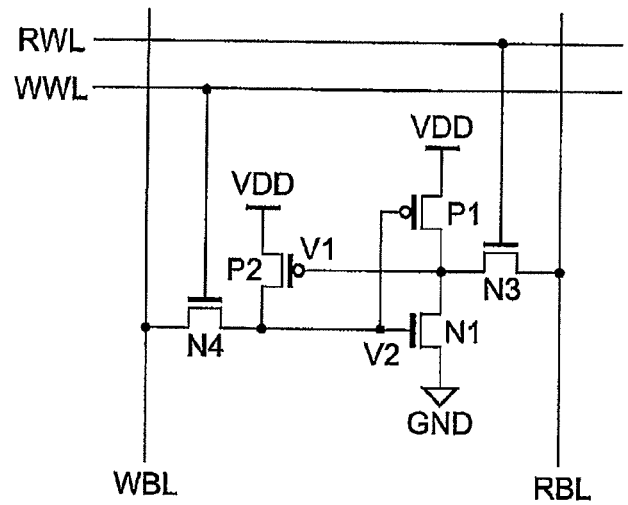
FIG. 7 is a diagram showing a circuit structure of an SRAM cell 1 according to Embodiment 1 of the present invention.
Figures 8A, 8B:
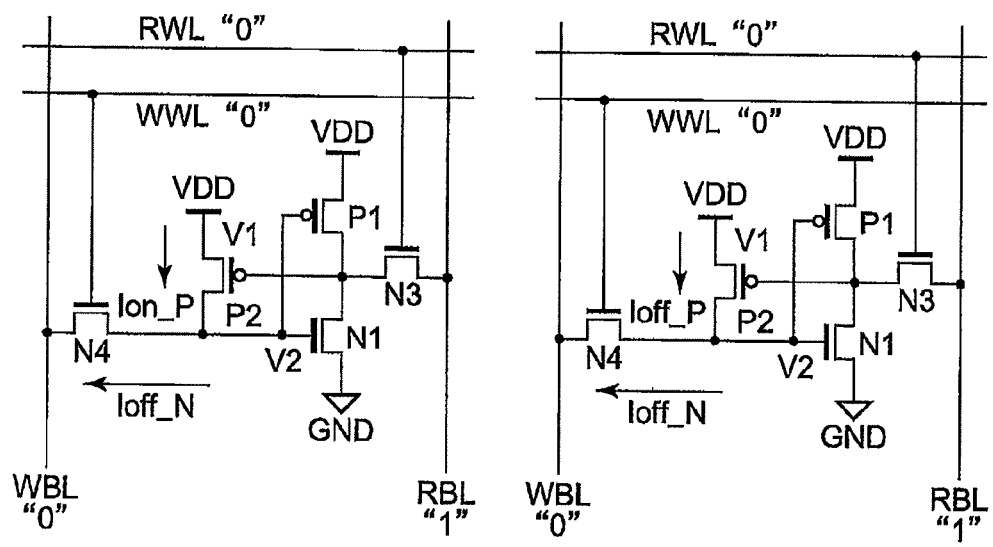
FIG. 8A is a diagram explanatory of a storage node V1 of "0" in a holding state of the SRAM cell 1 in Embodiment 1.
FIG. 8B is a diagram explanatory of the storage node V1 of "1" in a holding state of the SRAM cell 1 in Embodiment 1.
Figure 9:
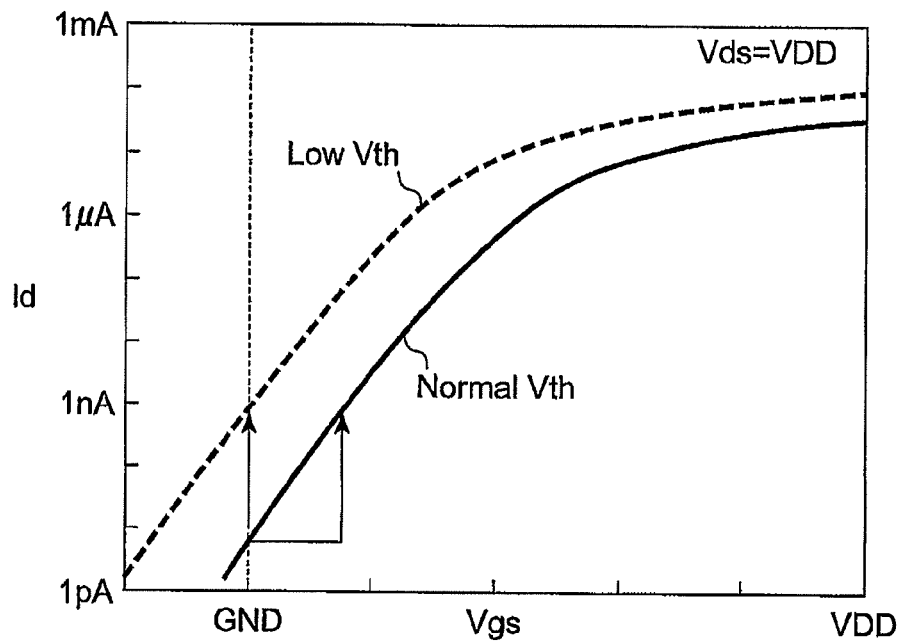
FIG. 9 is a graph showing a gate voltage (Vgs)-drain current (Id) curve of transistors.
Figures 10A, 10B:
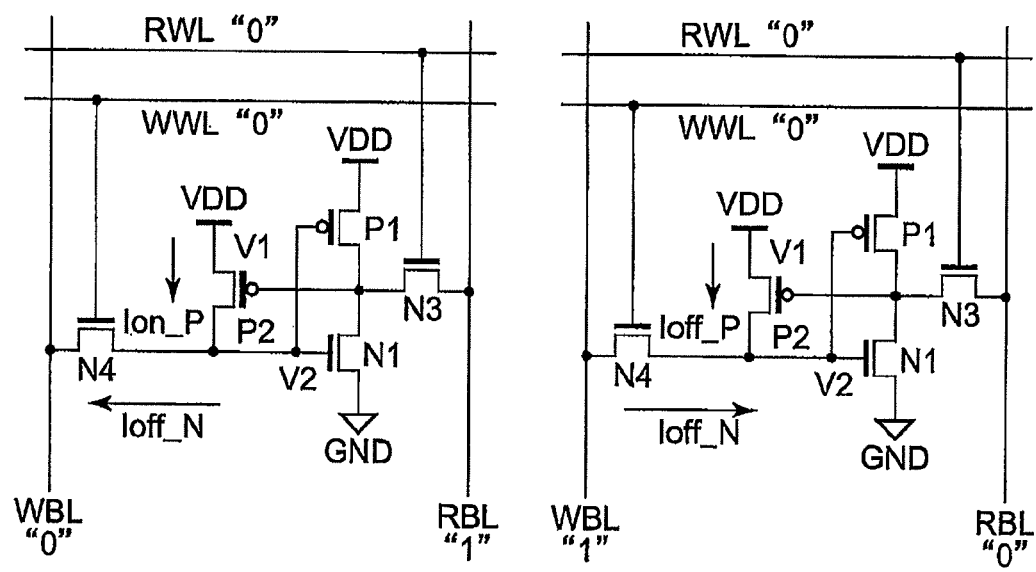
FIG. 10A is a diagram explanatory of a state of a storage node V2 of "1" and a write bit line WBL of "0" in a writing state of the SRAM cell 1 in Embodiment 1.
FIG. 10B is a diagram explanatory of a state of a storage node V2 of "0" and a write bit line WBL of "1" in a writing state of the SRAM cell 1 in Embodiment 1.
Figure 11:
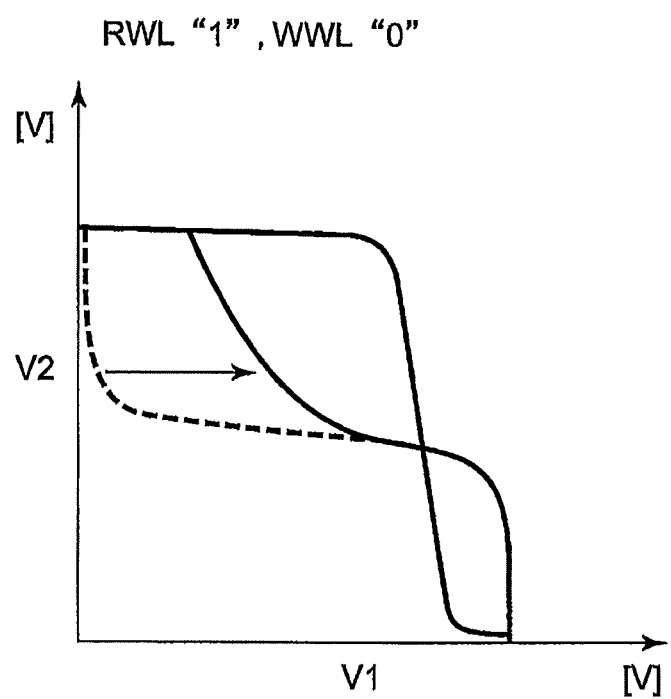
FIG. 11 is a graph showing an SNM (Static Noise Margin) according to the present invention.

Embodiment 1 of the present invention will be described below with reference to FIGS. 7 to 12D. FIG. 7 is a diagram showing a circuit structure of an SRAM cell. FIGS. 8A and 8B are diagrams showing (a) a storage node V1 holding "0" and (b) a storage node V1 holding "1" in a holding state of the SRAM cell. FIG. 9 shows a gate voltage (Vgs)-drain current (Id) curve of transistors. FIGS. 10A and 10B are diagrams explanatory of (a) erroneous writing in a state in which a storage node V2 holds "1" with a write bit line WBL of "0" and (b) erroneous writing in a state in which a storage node V2 holds "0" with a write bit line WBL of "1" in a non-selected cell during a writing operation in the SRAM cell. FIG. 11 is a graph showing an SNM according to the present invention. FIGS. 12A to 12D are operation waveforms.

Hereinafter, SRAM cells are referred to as an SRAM cell 1 and an SRAM cell 2 if they are limited to SRAM cells in Embodiments 1 and 2, and simply referred to as SRAM cells unless otherwise specified.

The SRAM cell 1 shown in FIG. 7 is formed by five transistors including a PMOS transistor P1 and an NMOS transistor N1, which forms a CMOS inverter, a PMOS transistor P2, and NMOS transistors N3 and N4, which serves as access means. The SRAM cell 1 differs from a conventional 6-transistor SRAM cell in deletion of a drive transistor N2, separation of a word line into a read word line RWL and a write word line WWL, and provision of a write-only bit line WBL.

The CMOS inverter is formed by the PMOS transistor P1 and the NMOS transistor N1. The CMOS inverter uses data of a storage node V2 as an input and outputs data to a storage node V1. The PMOS transistor P1 has a drain, a source, and a gate connected to the storage node V1, a power source voltage, and the storage node V2, respectively. The NMOS transistor N1 has a drain, a source, and a gate connected to the storage node V1, a ground potential, and the storage node V2, respectively. The PMOS transistor P2 has a drain, a source, and a gate connected to the storage node V2, the power source voltage, and the storage node V1, respectively.

The NMOS transistor N3 is connected between a read bit line RBL and the storage node V1. The NMOS transistor N3 has a gate connected to a read word line RWL. The NMOS transistor N4 is connected between a write bit line WBL and the storage node V2. The NMOS transistor N4 has a gate connected to a write word line WWL.

A method of holding data in operation of the memory cell in the present embodiment will be described with reference to FIGS. 8A and 8B. FIG. 8A shows a case in which the storage node V1 holds "0" and the storage node V2 holds "1." Since the storage node V1 has "0," the PMOS transistor P2 is turned on. Because an on-state current $Ion\_P$ of the PMOS transistor P2 is larger than an off-state leakage current $Ioff\_N$ of the NMOS transistor N4, the storage node V2 is brought into a high level "1." Since the storage node V2 has a high level "1," the NMOS transistor N1 is turned on, so that the storage node V1 is pulled down into a low level "0." The storage nodes V1 and V2 are stably held by turning the PMOS transistor P2 and the NMOS transistor N1 on.

Figure 1:
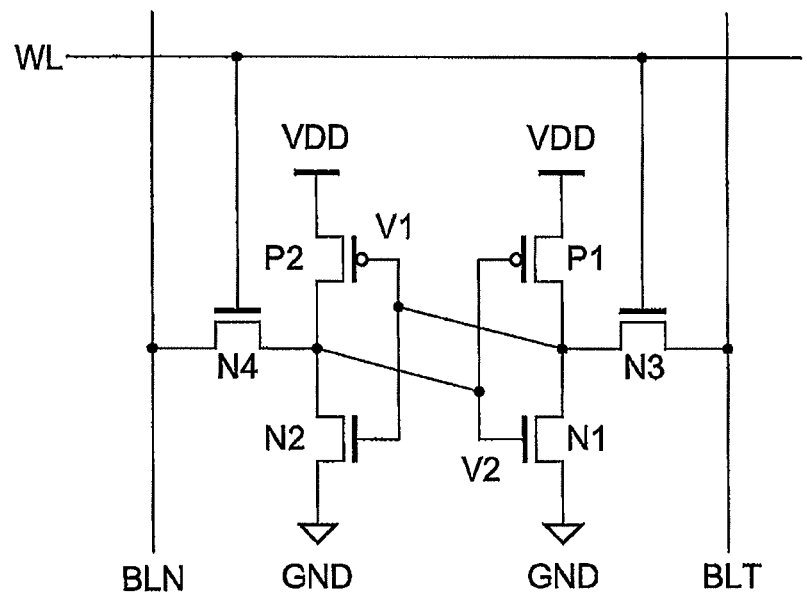
FIG. 1 is a circuit diagram of a conventional 6-transistor SRAM cell.
Figure 2:
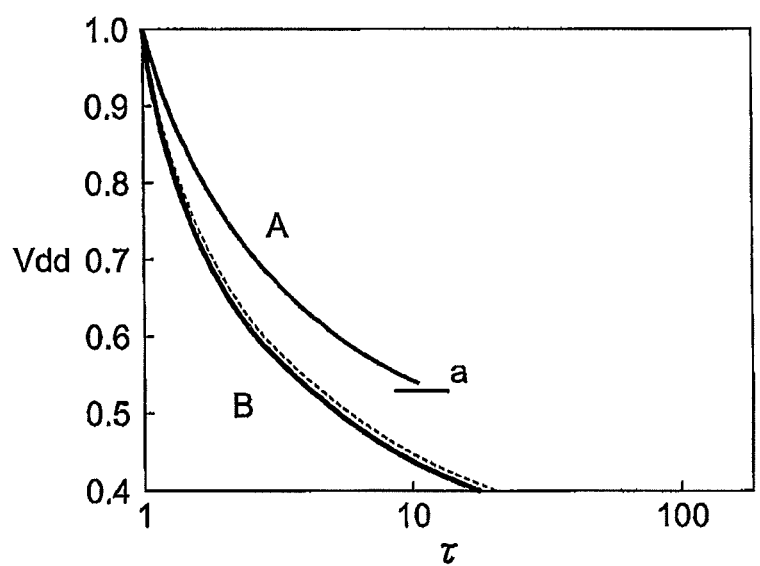
FIG. 2 is a graph showing dependence of delay time of a conventional SRAM cell and a CMOS inverter on power source voltages.
Figure 3A:
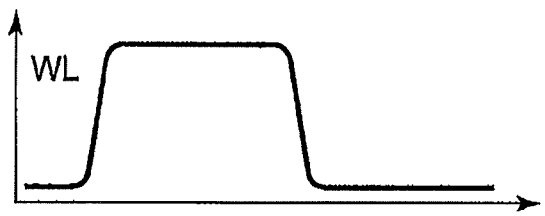
FIGS. 3A to 3C are charts showing a reading operation of a conventional SRAM cell.
Figure 3B:
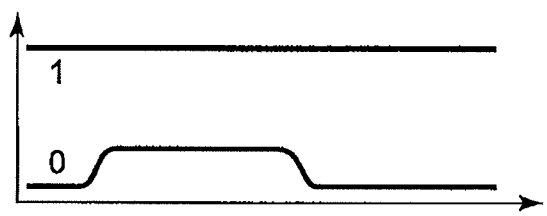
Figure 3C:
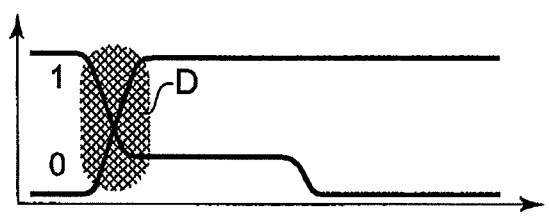
Figure 4:
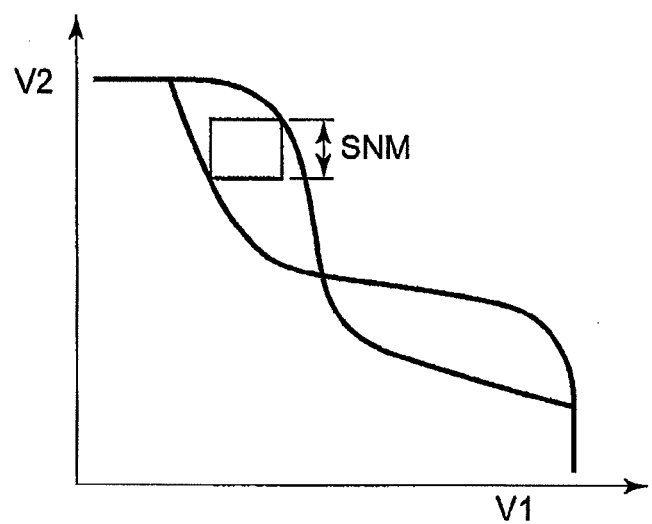
FIG. 4 is an explanation graph of an SNM showing a stable operation in a conventional SRAM cell.
Figure 5:
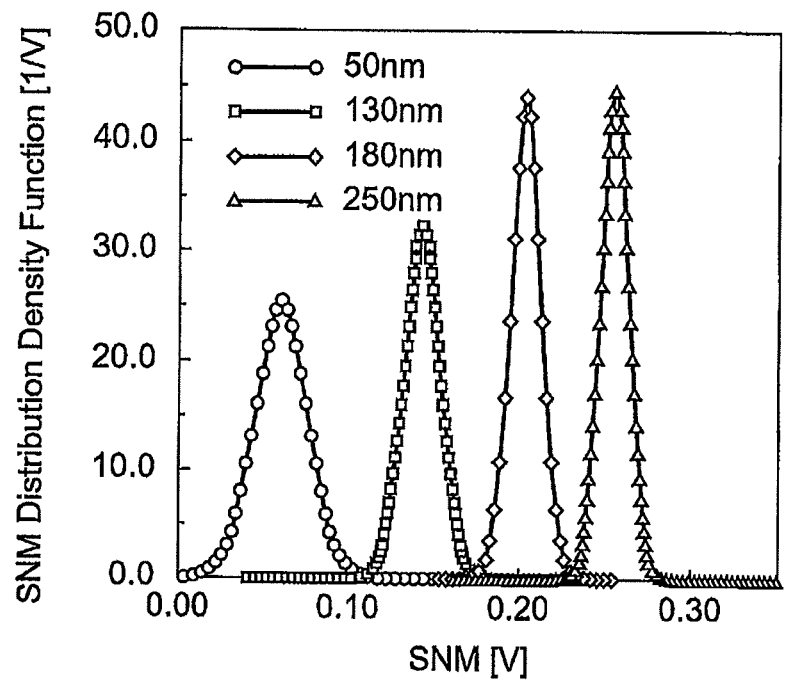
FIG. 5 is a graph showing dependence of SNMs in a conventional SRAM cell on channel lengths of transistors.
Figure 6:
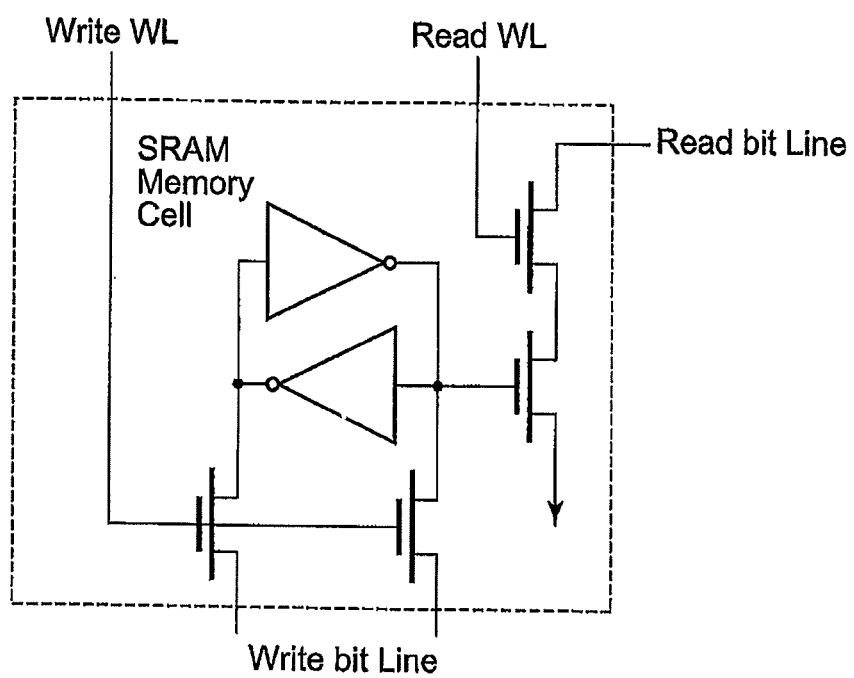
FIG. 6 is a circuit diagram of a conventional 8-transistor SRAM cell.

FIG. 8B shows a case in which the storage node V1 holds "1" and the storage node V2 holds "0." Since the transistor N2 for holding the storage node V2 at a low level "0" in the SRAM cell shown in FIG. 1 has been deleted from the SRAM cell 1 shown in FIG. 7, a state of "1" on the storage node V1 and "0" on the storage node V2 could not be held stably. In this regard, according to the present invention, the off-state leakage current $Ioff\_N$ of the NMOS transistor N4 is set to be larger than an off-state leakage current $Ioff\_P$ of the PMOS transistor P2. This allows the storage node V2 to be held at a low level "0." When the storage node V2 is held at a low level "0," the PMOS transistor P1 is turned on, so that the storage node V1 can be held at a high level "1."

Thus, an artificial inverter circuit outputting the storage node V2 is formed by the PMOS transistor P2 and the NMOS transistor N4. A high level "1" is outputted to the storage node V2 when the PMOS transistor P2 is turned on, whereas a low level "0" is outputted to the storage node V2 when the PMOS transistor P2 is turned off.

The storage node V2 is held at a low level "0" by setting the off-state leakage current $Ioff\_N$ of the NMOS transistor N4 to be larger than the off-state leakage current $Ioff\_P$ of the PMOS transistor P2. Conversely, the storage node V2 is held at a high level "1" because the off-state leakage current $Ioff\_N$ of the NMOS transistor N4 is smaller than the on-state current $Ion\_P$ of the PMOS transistor P2. Thus, magnitudes of these currents are expressed by $Ioff\_P<Ioff\_N<Ion\_P$.

Here, it is desirable that the off-state leakage current $Ioff\_N$ of the NMOS transistor N4 be set to be about 100 times as large as the off-state leakage current $Ioff\_P$ of the PMOS transistor P2. The reason why the off-state leakage current $Ioff\_N$ is set to be about 100 times as large as the off-state leakage current $Ioff\_P$ is because the relationship of $Ioff\_P<Ioff\_N$ is maintained even if the off-state leakage current varies. For example, when the off-state leakage current $Ioff\_P$ of the PMOS transistor P2 is several pA, the off-state leakage current $Ioff\_N$ of the NMOS transistor N4 is set to be about several hundreds of pA to about several nA.

There are several methods to increase the off-state leakage current $Ioff\_N$ of the NMOS transistor N4. In a first method, the NMOS transistor N4 is formed by a transistor having a low threshold voltage Vth that is lower than other normal threshold voltages (e.g., a threshold voltage of the NMOS transistor N3). When a threshold voltage is reduced by about 0.2 V, the leakage current increases about 100 times. FIG. 9 shows gate voltages (Vgs) and currents (Id) of a transistor having a normal threshold voltage (Normal Vth) and a transistor having a low threshold voltage (Low Vth). When a gate voltage of the NMOS transistor N4 is set to be the GND potential, a ratio of leakage currents in the transistor having a normal threshold voltage (Normal Vth) and the transistor having a low threshold voltage (Low Vth) becomes about 100.

In a second method, a threshold voltage Vth of the NMOS transistor N4 is set to be a normal threshold voltage, and a low level of the write word line WWL is set to be 0.2 V higher than usual. When the low level of the write word line WWL is set to be 0.2 V higher, the leakage current increases about 100 times. In a third method, the first method and the second method are combined with each other. For example, the threshold voltage Vth of the NMOS transistor N4 is set to be 0.1 V lower than usual while a low level of the write word line WWL is set to be 0.1 V higher than usual. This method can also increase the leakage current $Ioff\_N$ about 100 times.

As described above, the holding of an SRAM cell formed by five transistors can be achieved by setting an off-state leakage current of the access transistor N4 to be large. However, in the case of a large off-state leakage current, it is feared that data to be written into a selected SRAM cell will also be written into a non-selected SRAM cell in the same block during a writing operation.

Cases in which data to be written into a selected SRAM cell 1 are erroneously written into a non-selected SRAM cell 1 will be described with reference to FIGS. 10A and 10B. FIG. 10A shows a case in which data stored in the non-selected SRAM cell 1 include "0" on the storage node V1 and "1" on the storage node V2 while "0" on WBL and "1" on RBL are supplied as data to be written into a selected SRAM cell 1. In this case, the load transistor P2 is in an on-state and can supply a current larger than a leakage current of the access transistor N4. Accordingly, the high level of the storage node V2 is not lowered, and no erroneous writing is caused.

FIG. 10B shows a case in which data stored in the non-selected SRAM cell 1 include "1" on the storage node V1 and "0" on the storage node V2 while "1" on WBL and "0" on RBL are supplied as data to be written into a selected SRAM cell 1. Although the access transistor N4 is in an off-state, the leakage current of the access transistor N4 is so large that the storage node V2 is charged by the high level "1" of the write bit line WBL. Thus, the potential of the storage node V2 is increased, so that erroneous writing may be caused. Here, retention time is defined as a period of time during which the storage node V2 is increased to a threshold voltage of the drive transistor N1.

When the storage node V2 has a parasitic capacitance of 1 fF, the drive transistor N1 has a threshold voltage of 0.3 V, the load transistor has the worst off-state leakage current of 100 pA, and the access transistor N4 has an off-state leakage current of 100 nA under the worst conditions, then the retention time is calculated as 1 fF×0.3 v/100.1 nA≈3 ns. The storage node V2 is increased in 3 ns so as to turn the transistor N2 on. Thus, the potential of the storage node V1 is lowered to thereby cause erroneous writing in the SRAM cell 1.

In order to prevent such erroneous writing, the low level of the write word line WWL should be lowered in a writing operation so that the retention time is longer than a writing cycle. For example, if the low level of the write word line WWL is lowered by 0.2 V, then the off-state leakage current of the access transistor N4 is reduced to one hundredth thereof so that it becomes 1 nA. In this case, the retention time is calculated as 1 fF×0.3 v/1.1 nA=273 ns. Thus, erroneous writing can be prevented for a short writing cycle. The control of the word line potential for the non-selected SRAM cell 1 will be described in detail in another embodiment. The selected SRAM cell 1 will be described in the present embodiment.

Operation of the SRAM cell 1 formed by five transistors in the present embodiment will be described with reference to FIGS. 11 and 12A to 12D. FIG. 11 shows an SNM. As compared to a 6-transistor SRAM cell, the drive transistor N2 is deleted, and an artificial inverter circuit is formed by the transistors P2 and N4. This artificial inverter circuit has a high threshold voltage, and the input-output characteristics thereof are shifted toward the power source voltage to a large extent. Another inverter circuit is formed by the transistors P1 and N1, and the input-output characteristics thereof are the same as those of a usual 6-transistor type. Accordingly, the SNM becomes asymmetric as shown in FIG. 11.

An operation margin is enlarged in a state where a low level "0" is stored on the storage node V1, in which stored data are likely to be corrupted in a reading operation with the read bit line RBL. An operation margin is reduced in a state where a high level "1" is stored on the storage node V1. However, in the state where a high level "1" is stored on the storage node V1 with a reduced operation margin, even if the read bit line RBL having a high level "1" is connected, no corruption of stored data is caused. Accordingly, an erroneous operation cannot be performed. Therefore, an operation margin of the SRAM cell is enlarged. Furthermore, in a state where a high level "1" is stored on the storage node V1, as described above, the storage node V2 can be held at a low level "0" by setting the off-state leakage current of the access transistor N4 to be larger than the off-state leakage current of the load transistor P2.

FIGS. 12A to 12D show operation timing of the SRAM cell 1 according to the present invention. FIGS. 12A to 12D illustrate (a) "0" reading operation, (b) "1" reading operation, (c) "0" writing operation, and (d) "1" writing operation. Here, data stored on the storage node V1 of the SRAM cell 1 are defined as stored data of the SRAM cell 1. Furthermore, inverse data of data stored in the SRAM cell 1 are written in a writing operation.

Figure 12A:
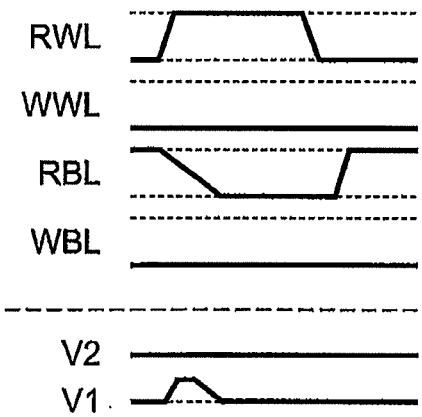
FIG. 12A is a waveform chart explanatory of an operation ("0" reading) in Embodiment 1.

In the case of the "0" reading operation shown in FIG. 12A, the read word line RWL is activated to have a high level "1." When the read word line RWL is activated, the access transistor N3 is brought into an on-state, so that the read bit line RBL and the storage node V1 of the SRAM cell 1 are brought into conduction with each other. The potential of the storage node V1 is slightly pulled up by the read bit line RBL that has been charged at a pre-charge level "1."However, the storage node V1 is pulled down to a low level "0" together with the read bit line RBL by the drive transistor N1. Furthermore, since the read bit line RBL is pulled down to a low level, a data reading operation of the low level "0" is performed.

In this case, an operation margin is enlarged because the drive transistor N2 has been deleted and the high level "1" stored on the storage node V2 is not discharged. After completion of the reading operation, the read word line RWL is brought into a low level "0," and the read bit line RBL is pre-charged into a high level "1." During the reading cycle, each of the write word line WWL and the write bit line WBL is held at a low level "0" and is not varied.

Figure 12B:
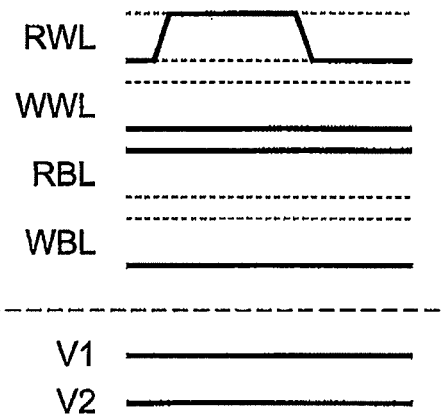
FIG. 12B is a waveform chart explanatory of an operation ("1" reading) in Embodiment 1.

In the case of the "1" reading operation shown in FIG. 12B, the read word line RWL is activated to have a high level "1." When the read word line RWL is activated, the access transistor N3 is brought into an on-state, so that the read bit line RBL and the storage node V1 of the SRAM cell 1 are brought into conduction with each other. Since the read bit line RBL charged at a pre-charge level "1" has the same level as the high level "1" stored on the storage node V1, a data reading operation of the high level "1" is directly performed. After completion of the reading operation, the read word line RWL is brought into a low level "0," and the read bit line RBL is pre-charged at a high level "1." During this reading cycle, each of the write word line WWL and the write bit line WBL is held at a low level "0" and is not varied.

Figure 12C:
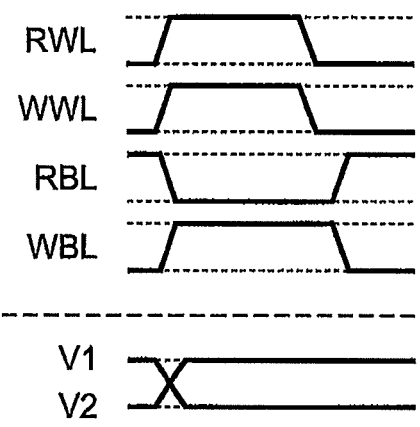
FIG. 12C is a waveform chart explanatory of an operation ("0" writing) in Embodiment 1.

In the case of the "0" writing operation shown in FIG. 12C, both of the read word line RWL and the write word line WWL are activated to have a high level "1." Both of the access transistors N3 and N4 are brought into an on-state, the read bit line RBL is brought into conduction with the storage node V1, and the write bit line WBL is brought into conduction with the storage node V2. The low level "0" of the read bit line RBL is written into the storage node V1, and the high level "1" of the write bit line WBL is written into the storage node V2. After completion of the writing operation, the read word line RWL and the write word line WWL are brought into a low level "0." Subsequently, the read bit line RBL is pre-charged into a high level "1," and the write bit line WBL is pre-charged into a low level "0."

Figure 12D:
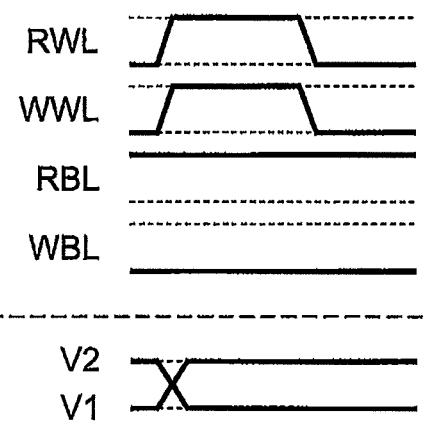
FIG. 12D is a waveform chart explanatory of an operation ("1" writing) in Embodiment 1.

In the case of the "1" writing operation shown in FIG. 12D, both of the read word line RWL and the write word line WWL are activated to have a high level "1." Both of the access transistors N3 and N4 are brought into an on-state, the read bit line RBL is brought into conduction with the storage node V1, and the write bit line WBL is brought into conduction with the storage node V2. The high level "1" of the read bit line RBL is written into the storage node V1, and the low level "0" of the write bit line WBL is written into the storage node V2. After completion of the writing operation, the read word line RWL and the write word line WWL are brought into a low level "0." Subsequently, the read bit line RBL is pre-charged at a high level "1," and the write bit line WBL is pre-charged at a low level "0."

In the present embodiment, the SRAM cell is formed by the five transistors. The SRAM cell is formed by an inverter circuit using a storage node V2 as an input and a storage node V1 as an output, a load transistor connected between a power source and the storage node V2 with using the storage node V1 as an input, an access transistor N3 connected between a read bit line and the storage node V1, and an access transistor N4 connected between a write bit line and the storage node V2. When the access transistor N4 is controlled by a write word line WWL, the access transistor N4 can be used as holding control means and writing means for the memory cell, making it possible to obtain a semiconductor device capable of operating at a high speed with a small number of elements.

(Embodiment 2)

Figure 13:
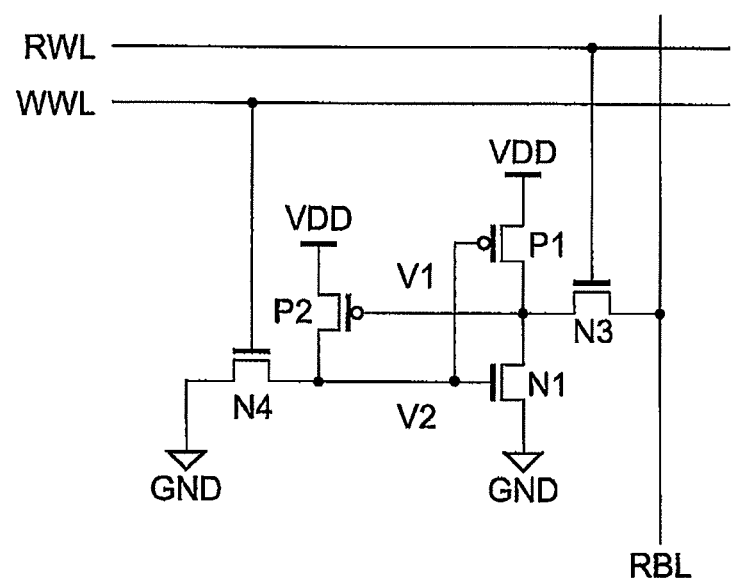
FIG. 13 is a diagram showing a circuit structure of an SRAM cell 2 according to Embodiment 2 of the present invention.

Embodiment 2 of the present invention will be described below with reference to FIGS. 13 and 14A to 14D. FIG. 13 shows a circuit structure of an SRAM cell 2 in Embodiment 2, and FIGS. 14A to 14D show its operation waveforms.

The SRAM cell 2 shown in FIG. 13 differs from the SRAM cell 1 in Embodiment 1 in that a write bit line WBL is fixed to a ground potential GND. Other components are the same as those in Embodiment 1. Accordingly, those components are denoted by the same reference numerals as in Embodiment 1, and the details thereof are omitted.

When the SRAM cell 2 in Embodiment 2 is to be held, both of the read word line RWL and the write word line WWL are brought into a low level "0." At that time, as with Embodiment 1, each of the storage nodes V1 and V2 can be held by setting an off-state leakage current Ioff_N of the access transistor N4 under the conditions of Ioff_P<Ioff_N<Ion_P.

The operation will be described below with reference to FIGS. 14A to 14D. FIGS. 14A to 14D show operation waveforms in (a) "0" reading operation, (b) "1" reading operation, (c) "0" writing operation, and (d) "1" writing operation. In the cases of the "0" reading operation shown in FIG. 14A and the "1" reading operation shown in FIG. 14B, the storage node V1 of "0" or "1" is read into the read bit line RBL by using the read word line RWL, the read bit line RBL, and the access transistor N3. As shown in FIGS. 14A and 14B, the operations are the same as those in Embodiment 1, and the details thereof are omitted.

In Embodiment 1, a writing operation is performed on the SRAM cell 1 by complementary data input from the read bit line RBL and the write bit line WBL. However, in Embodiment 2, since the write bit line WBL is fixed to the ground potential, a short one-shot pulse is provided to the write word line WWL, and a writing level of the read bit line RBL is written into the storage node V1 after the storage node V2 is reset to a low level "0."

In the case of the "0" writing operation shown in FIG. 14C, both of the read word line RWL and the write word line WWL are activated to have a high level "1." Both of the access transistors N3 and N4 are brought into an on-state, and the storage node V1 is brought into conduction with the read bit line RBL, so that a low level "0" of the read bit line RBL is written into the storage node V1. On the other hand, the storage node V2 is brought into an intermediate level because both of the transistor P2 and the transistor N4 are turned on. At that time, the write word line WWL of a one-shot pulse is brought into a low level "0" so as to turn the transistor N4 off and pull the storage node V2 up to a high level "1." Thus, "0" is written into the storage node V1, and "1" is written into the storage node V2. After completion of the writing operation, the read word line RWL is brought into a low level "0." Subsequently, the read bit line RBL is pre-charged into a high level "1."

In the case of the "1" writing operation shown in FIG. 12D, both of the read word line RWL and the write word line WWL are activated to have a high level "1." Both of the access transistors N3 and N4 are brought into an on-state, and the storage node V1 is brought into conduction with the read bit line RBL, so that a high level "1" of the read bit line RBL is written into the storage node V1. On the other hand, the storage node V2 is brought into the ground potential GND by the access transistor N4, and a low level "0" is written into the storage node V2. Here, since the transistor P2 is in an off-state, a low level "0" is written into the storage node V2 without having pulled the storage node V2 up to an intermediate level. While the write word line WWL has a high level, "1" is written into the storage node V1 and "0" is written into the storage node V2. Only the write word line WWL is brought into a low level "0" so as to turn the transistor N4 off. Subsequently, the read word line RWL is brought into a low level "0," and the read bit line RBL is pre-charged at a high level "1."

In the present embodiment, the SRAM cell is formed by the five transistors. The SRAM cell is formed by an inverter circuit using a storage node V2 as an input and a storage node V1 as an output, a load transistor connected between a power source and the storage node V2 with using the storage node V1 as an input and the storage node V2 as an output, an access transistor N3 connected between a read bit line and the storage node V1, and an access transistor N4 connected between the ground potential and the storage node V2. When the access transistor N4 is controlled by a one-shot write word line WWL, the access transistor N4 can be used as holding control means and writing means for the memory cell, making it possible to obtain a semiconductor device capable of operating at a high speed with a small number of elements.

(Embodiment 3)

Figure 15:
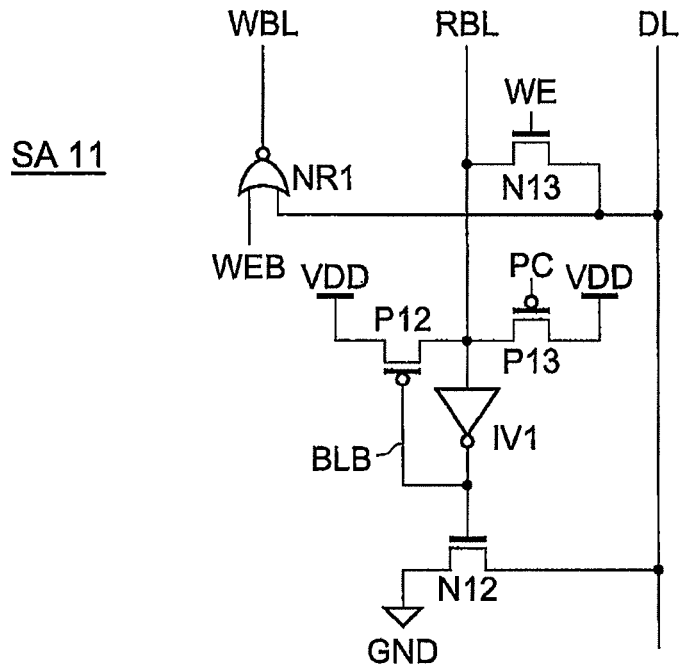
FIG. 15 is a diagram showing a circuit structure of a sense amplifier SA11 according to the present invention.
Figure 16:
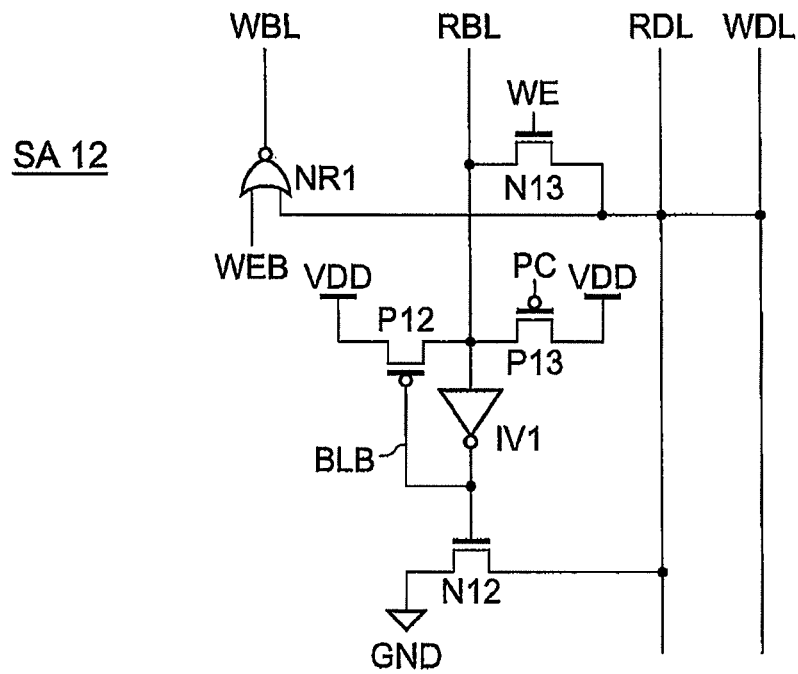
FIG. 16 is a diagram showing a circuit structure of a sense amplifier SA12 according to the present invention.

Embodiment 3 of the present invention is an embodiment in which a sense amplifier for communicating data with a memory cell and an input-output circuit is added to the SRAM cell 1. In the present embodiment, a data reading operation is performed by one bit line of the read bit line RBL, and a data writing operation is performed by two bit lines of the read bit line RBL and the write bit line WBL. A sense amplifier SA11 performs data transmission to an input-output circuit via one line of a data line DL, and a sense amplifier SA12 performs data transmission to an input-output circuit via two lines of a read data line RDL and a write data line WDL. FIG. 15 shows a circuit structure diagram of the sense amplifier SA11, FIG. 16 shows a circuit structure diagram of the sense amplifier SA12, and FIGS. 17A to 17D show their operation waveforms.

The circuit structure of the sense amplifier SA11 shown in FIG. 15 will be described. An output BLB of an inverter IV1, to which data are inputted through the read bit line RBL from the memory cell, is inputted to gates of a PMOS transistor P12 and an NMOS transistor N12. The PMOS transistor P12 has a source connected to a power source voltage VDD and a drain connected to the read bit line RBL. The PMOS transistor P12 serves as a transistor for maintaining a bit line high level to maintain the read bit line RBL at a high level when it is turned on. The NMOS transistor N12 serves as a read transistor having a source connected to a ground potential GND and a drain connected to the data line DL.

A write NMOS transistor N13 having a gate to which a write enable signal WE is inputted is connected between the data line DL and the read bit line RBL. Furthermore, an output of a NOR circuit NR1, to which an inverse write enable signal WEB and the data line DL are inputted, is connected to the write bit line WBL. The input of the inverse write enable signal WEB into the NOR circuit NR1 allows the NOR circuit NR1 to pre-charge and fix the write bit line WBL of its output into a low level "0" except in a writing operation. Furthermore, a source, a drain, and a gate of a PMOS transistor P13 for pre-charge are connected to the power source voltage VDD, the read bit line WBL, and a pre-charge signal PC, respectively.

In a basic operation of the sense amplifier SA11, data are read from the memory cell into the read bit line RBL and transmitted via the inverter IV1 and the read transistor N12 to the data line DL in a reading operation. In a writing operation, data from the data line DL are passed through the transistor N13 and the NOR circuit NR1, and complementary data are transmitted to the read bit line RBL and the write bit line WBL and written into the memory cell. The level maintaining transistor P12 and the pre-charge transistor P13 operate to complement these operations.

The sense amplifier SA12 shown in FIG. 16 is configured such that the data line DL in the sense amplifier SA11 shown in FIG. 15 is separated into a write data line WDL and a read data line RDL. The write data line WDL is connected to a write transistor N13, and the read data line RDL is connected to a read transistor N12. The deference between the sense amplifiers SA11 and SA12 results from the arrangement of the input-output circuits. However, the sense amplifiers SA11 and SA12 perform the same basic operation as a sense amplifier. The sense amplifier SA11 is used when the input-output circuit not illustrated has both functions of input and output, whereas the sense amplifier SA12 is used when the input-output circuit is separated into an input circuit and an output circuit.

FIGS. 17A to 17D illustrate operation waveforms showing one embodiment of the operation in the sense amplifier SA11. Memory cells to which the sense amplifier SA11 can be applied are not limited to specific ones. However, application to the memory cell of the first embodiment will be described as one embodiment of the operation.

Figure 17A:
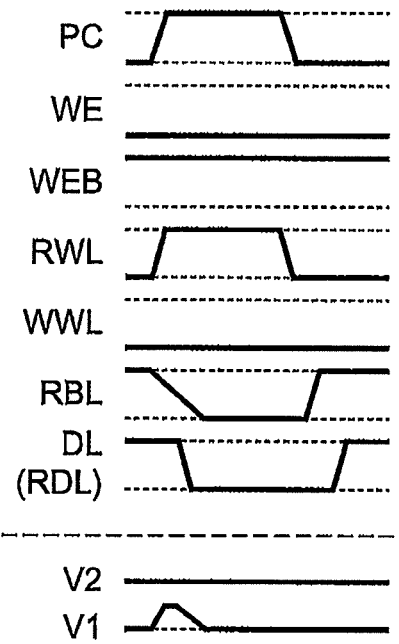
FIG. 17A is a waveform chart explanatory of an operation ("0" reading) in the sense amplifiers SA11 and SA12 shown in FIGS. 15 and 16.
Figure 17B:
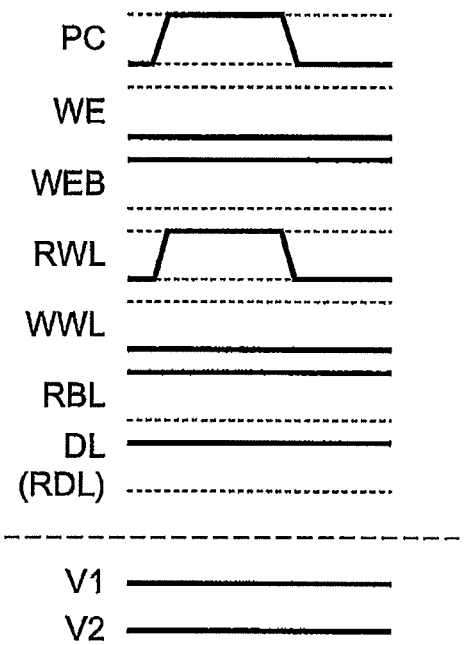
FIG. 17B is a waveform chart explanatory of an operation ("1" reading) in the sense amplifiers SA11 and SA12 shown in FIGS. 15 and 16.

In the cases of a "0" reading operation shown in FIG. 17A and a "1" reading operation shown in FIG. 17B, the write word line WWL and the write enable signal WE remains a low level "0" and the inverse write enable signal WEB remains a high level "1" during a reading period. Accordingly, an operation of the sense amplifier SA11 is controlled by the pre-charge signal PC and the read word line RWL. The pre-charge signal is brought into a high level "1," so that the transistor P13 is turned off. Thus, a pre-charge operation is completed. The read word line RWL is brought into a high level "1" so as to bring the memory cell into conduction with the read bit line RBL. Thus, data of "0" or "1" in the memory cell are read into the read bit line RBL. Furthermore, the data are read into the data line DL via the inverter IV1 and the read transistor N12.

Figure 17C:
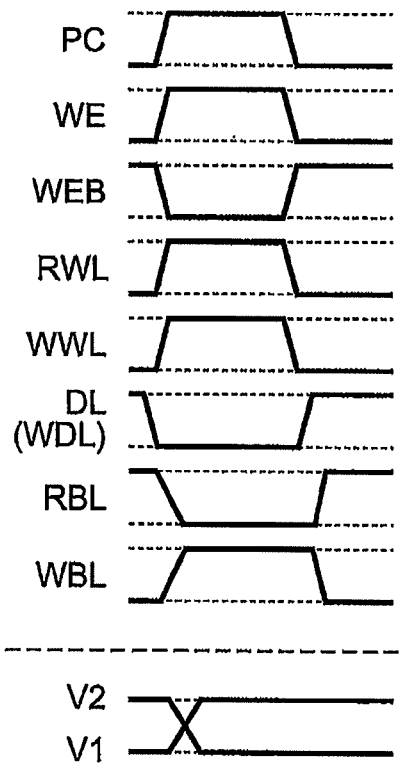
FIG. 17C is a waveform chart explanatory of an operation ("0" writing) in the sense amplifiers SA11 and SA12 shown in FIGS. 15 and 16.
Figure 17D:
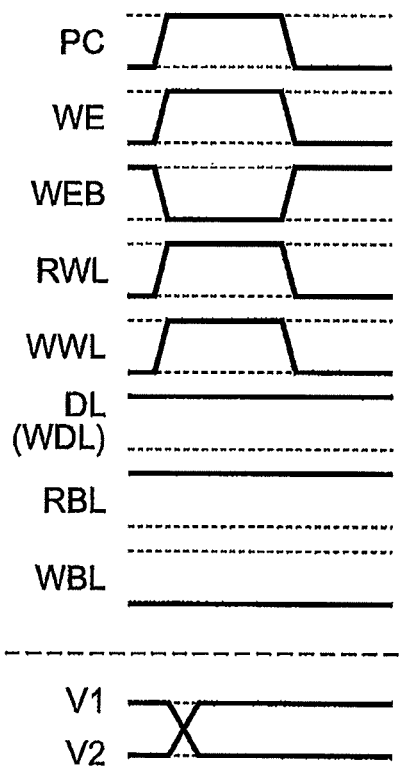
FIG. 17D is a waveform chart explanatory of an operation ("1" writing) in the sense amplifiers SA11 and SA12 shown in FIGS. 15 and 16.

In the cases of a "0" writing operation shown in FIG. 17C and a "1" writing operation shown in FIG. 17D, the pre-charge signal PC and the write enable signal WE are changed into a high level "1," whereas the inverse write enable signal WEB is changed into a low level "0." Accordingly, the pre-charge transistor P13 is turned off. Thus, a pre-charge operation to the read bit line RBL is completed. Furthermore, a low level fixation operation of the write bit line WBL with the NOR circuit NR1 is completed. Data are transmitted from the data line DL via the write transistor N13 to the read bit line RBL, and inverse data of the data line DL are transmitted via the NOR circuit NR1 to the write bit line WBL.

The selected read word line RWL and write word line WWL are brought into a high level "1," and complementary data are written into the storage nodes V1 and V2 in the memory cell. After completion of the writing operation, the pre-charge signal PC, the write enable signal WE, the read word line RWL, and the write word line WWL are changed into a low level "0," and the inverse write enable signal WEB is changed into a high level "1." Thus, the data line DL and the read bit line are pre-charged into a high level "1," and the write bit line are pre-charged into a low level.

The operation of the sense amplifier SA11 has been described above. With regard to the sense amplifier SA12, as shown within parentheses of the data line DL in FIGS. 17A to 17D, the data line DL can be read as the read data line RDL in the reading operations and as the write data line WDL in the writing operations. Accordingly, the details of the operation of the sense amplifier SA12 are omitted.

The sense amplifier in the present embodiment performs data transmission to the memory cell with one bit line of the read bit line in the reading operation and with two bit lines of the read bit line and the write bit line in the writing operation. It is possible to obtain a sense amplifier capable of operating at a high speed, which is formed by an inverter circuit to which stored data of a memory cell are inputted from a bit line, a read transistor for transmitting an output of the inverter circuit to a data line, a transistor for maintaining a bit line high level to maintain the bit line at a high potential when the output of the inverter circuit has a low potential, writing means for transmitting write data and their inverse data to a read bit line and a write bit line, respectively, and means for pre-charging the read and write bit lines into a high potential and a low potential, respectively, when the read and write bit lines are ineffective.

(Embodiment 4)

Figure 18:
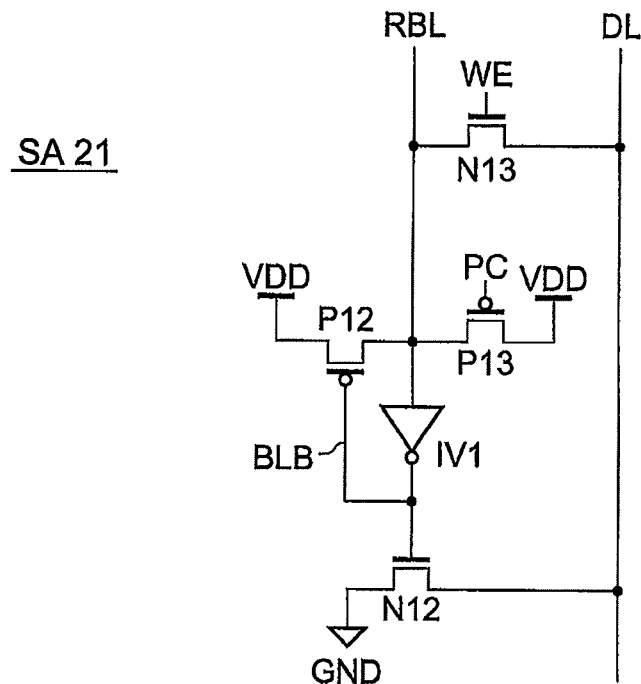
FIG. 18 is a diagram showing a circuit structure of a sense amplifier SA21 according to the present invention.
Figure 19:
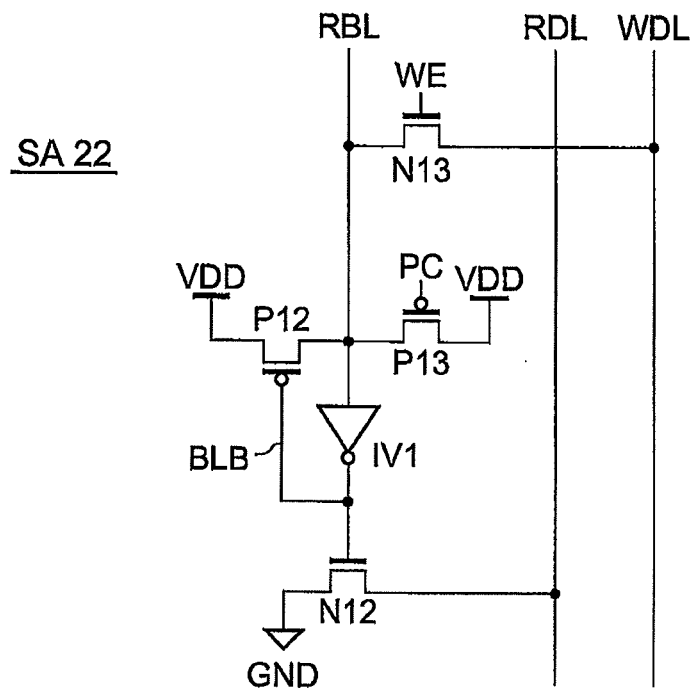
FIG. 19 is a diagram showing a circuit structure of a sense amplifier SA22 according to the present invention.

Embodiment 4 of the present invention is an embodiment in which a sense amplifier for communicating data with a memory cell and an input-output circuit is added to the SRAM cell 2. FIG. 18 shows a circuit structure diagram of a sense amplifier SA21, FIG. 19 shows a circuit structure diagram of a sense amplifier SA22, and FIGS. 20A to 20D show their operation waveforms. The sense amplifier SA21 performs data transmission to an input-output circuit via one line of a data line, and the sense amplifier SA22 performs data transmission to an input-output circuit via two lines of a read data line and a write data line.

In the sense amplifier SA21 shown in FIG. 18, an output BLB of an inverter IV1, to which data are inputted through the read bit line RBL from the memory cell, is inputted to gates of a PMOS transistor P12 and an NMOS transistor N12. The PMOS transistor P12 has a source connected to a power source voltage VDD and a drain connected to the read bit line RBL. The PMOS transistor P12 serves as a transistor for maintaining a bit line high level to maintain the read bit line RBL at a high level when it is turned on. The NMOS transistor N12 serves as a read transistor having a source connected to a ground potential GND and a drain connected to a data line DL.

A write NMOS transistor N13 having a gate to which a write enable signal WE is inputted is connected between the data line DL and the read bit line RBL. Furthermore, a source, a drain, and a gate of a PMOS transistor P13 for pre-charge are connected to the power source voltage VDD, the read bit line WBL, and a pre-charge signal PC, respectively.

In a basic operation of the sense amplifier SA21, data are read from the memory cell into the read bit line RBL and transmitted via the inverter IV1 and the read transistor N12 to the data line DL in a reading operation. In a writing operation, data are transmitted from the data line DL via the transistor N13 to the read bit line RBL and written into the memory cell. The level maintaining transistor P12 and the pre-charge transistor P13 operate to complement these operations.

The sense amplifier SA22 shown in FIG. 19 is configured such that the data line DL in the sense amplifier SA21 shown in FIG. 18 is separated into a write data line WDL and a read data line RDL. The write data line WDL is connected to a write transistor N13, and the read data line RDL is connected to a read transistor N12. The deference between the sense amplifiers SA21 and SA22 results from the arrangement of the input-output circuits. However, the sense amplifiers SA11 and SA12 perform the same basic operation as a sense amplifier. The sense amplifier SA21 is used when the input-output circuit has both functions of input and output, whereas the sense amplifier SA22 is used when the input-output circuit is separated into an input circuit and an output circuit.

FIGS. 20A to 20D illustrate operation waveforms showing one embodiment of the operation in the sense amplifier SA21. Memory cells to which the sense amplifier SA21 can be applied are not limited to specific ones. However, application to the memory cell of the second embodiment will be described as one embodiment of the operation.

In the cases of a "0" reading operation shown in FIG. 20A and a "1" reading operation shown in FIG. 20B, the write word line WWL and the write enable signal WE remains a low level "0" during a reading cycle. Accordingly, an operation of the sense amplifier SA21 is controlled by the pre-charge signal PC and the read word line RWL. The pre-charge signal PC is brought into a high level "1," so that the transistor P13 is turned off. Thus, a pre-charge operation is stopped. The read word line RWL is brought into a high level "1" so as to bring the memory cell into conduction with the read bit line RBL. Thus, data of "0" or "1" in the memory cell are read into the read bit line RBL. Furthermore, the data are read into the data line DL via the inverter IV1 and the read transistor N12.

In the case of a "0" writing operation shown in FIG. 20C, the pre-charge signal PC and the write enable signal WE are changed into a high level "1," so that the pre-charge transistor P13 is turned off. Thus, a pre-charge operation to the read bit line RBL is completed. Data are transmitted from the data line DL via the write transistor N13 to the read bit line RBL.

The selected read word line RWL and write word line WWL are brought into a high level "1," so that data "0" from the read bit line RBL are written into the storage node V1 of the memory cell. The storage node V2 of the memory cell is brought into an intermediate level by a current path between the load transistor P2 and the access transistor N4. At that time, the write word line WWL of a one-shot pulse is changed into a low level "0," so that the transistor N4 is turned off. Since the load transistor P2 is in an on-state, a high level "1" is written into the storage node V2.

After completion of the writing operation, the pre-charge signal PC, the write enable signal WE, the read word line RWL, and the write word line WWL are changed into a low level "0," and the data line DL and the read bit line are pre-charged into a high level "1."

In the case of a "1" writing operation shown in FIG. 20D, the pre-charge signal PC and the write enable signal WE are changed into a high level "1," so that the pre-charge transistor P13 is turned off. Thus, a pre-charge operation to the read bit line RBL is completed. Data are transmitted from the data line DL via the write transistor N13 to the read bit line RBL.

The selected read word line RWL and write word line WWL are brought into a high level "1," so that data "1" from the read bit line RBL are written into the storage node V1 of the memory cell and a low level "0" is written into the storage node V2 of the memory cell. The write word line WWL is brought into a low level "0." After completion of the writing operation, the pre-charge signal PC, the write enable signal WE, and the read word line RWL are changed into a low level "0," and the data line DL and the read bit line are pre-charged at a high level "1."

The operation of the sense amplifier SA21 has been described above. With regard to the sense amplifier SA22, as shown within parentheses of the data line DL in FIGS. 20A to 20D, the data line DL can be read as the read data line RDL in the reading operations and as the write data line WDL in the writing operations. Accordingly, the details of the operation of the sense amplifier SA22 are omitted.

The sense amplifier in the present embodiment performs data transmission to the memory cell with one bit line of the read bit line. It is possible to obtain a sense amplifier formed by an inverter circuit to which stored data of a memory cell are inputted from a bit line, a read transistor for transmitting an output of the inverter circuit to a data line, a transistor for maintaining a bit line high level to maintain the bit line at a high potential when the output of the inverter circuit has a low potential, a write transistor for transmitting write data to a read bit line, and means for pre-charging the read bit line into a high potential when the read bit line is ineffective.

(Embodiment 5)

Figure 21A:
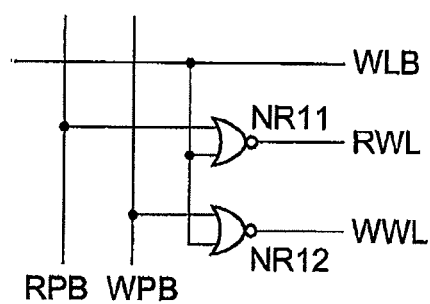
FIG. 21A is a diagram showing a sub-word driver SWD11 used in the present invention.
Figure 21B:
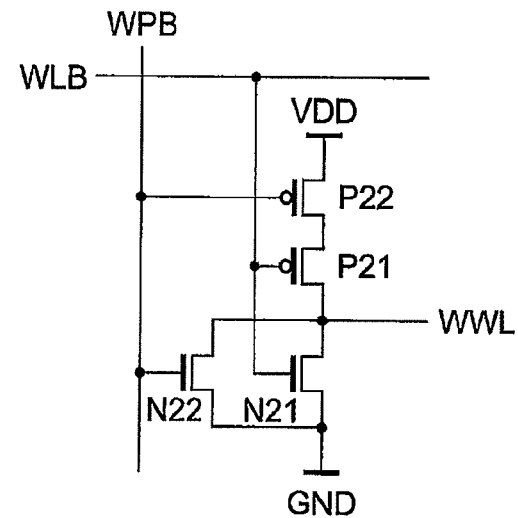
FIG. 21B is a diagram showing a write word line signal generation circuit NR12 used in the sub-word driver SWD11.
Figure 22A:
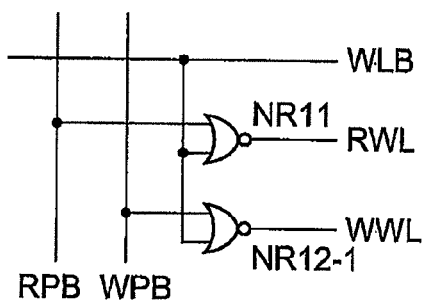
FIG. 22A is a diagram showing a sub-word driver SWD12 used in the present invention.
Figure 22B:
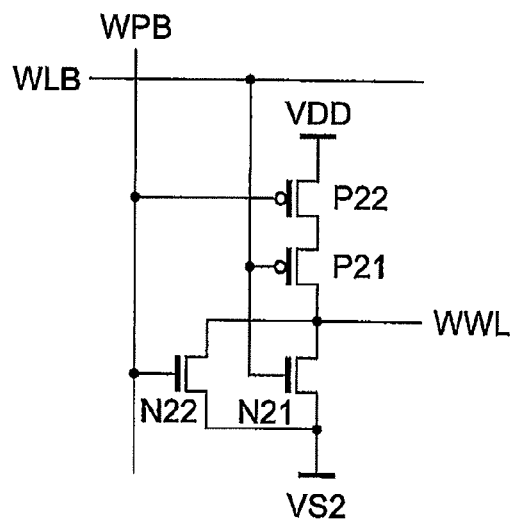
FIG. 22B is a diagram showing a write word line signal generation circuit NR12-1 used in the sub-word driver SWD12.
Figure 23A:
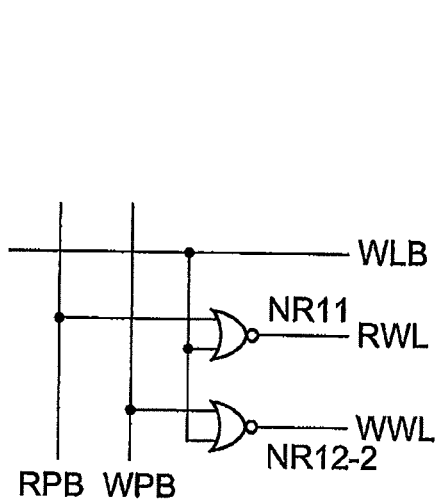
FIG. 23A is a diagram showing a sub-word driver SWD21 used in the present invention.
Figure 23B:
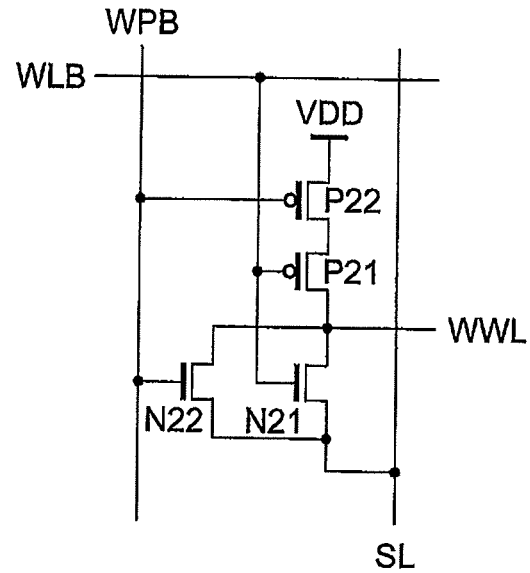
FIG. 23B is a diagram showing a write word line signal generation circuit NR12-2 used in the sub-word driver SWD21.

A structure of a sub-word driver circuit for generating signals for a read word line RWL and a write word line WWL and a control signal used in a sub-word decoder circuit will be described in Embodiment 5 of the present invention. FIGS. 21A and 21B show a sub-word driver SWD11 and a write word line signal generation circuit NR12 in the sub-word driver SWD11. FIGS. 22A and 22B show a sub-word driver SWD12 and a write word line signal generation circuit NR12-1 in the sub-word driver SWD12. FIGS. 23A and 23B show a sub-word driver SWD21 and a write word line signal generation circuit NR12-2 in the sub-word driver SWD21.

Figure 24A:
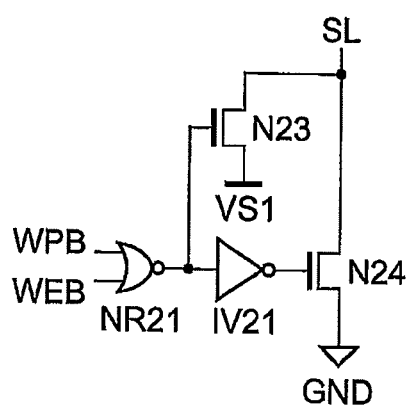
FIG. 24A is a circuit structure diagram of a source potential generation circuit SLC1 for supplying a low potential power source voltage SL to the write word line signal generation circuit NR12-2 in the sub-word driver SWD21.
Figure 24B:
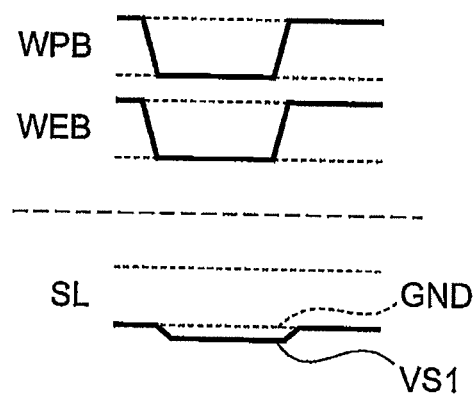
FIG. 24B is a diagram showing an operation waveform of the source potential generation circuit SLC1.
Figure 25A:
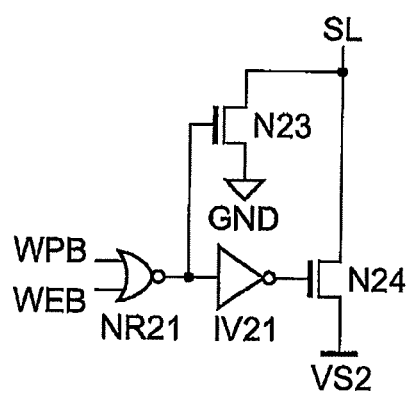
FIG. 25A is a circuit structure diagram of a source potential generation circuit SLC2 for supplying a low potential power source voltage SL to the write word line signal generation circuit NR12-2 in the sub-word driver SWD21.
Figure 25B:
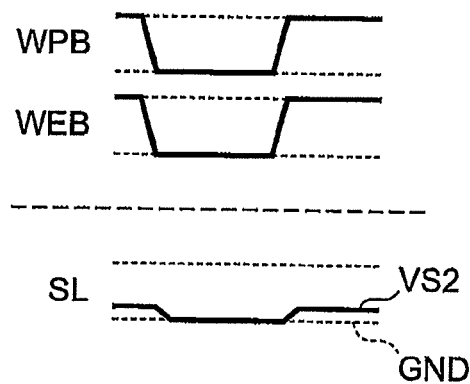
FIG. 25B is a diagram showing an operation waveform of the source potential generation circuit SLC2.
Figure 26A:
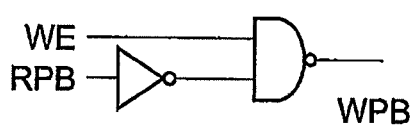
FIG. 26A is a circuit structure diagram of an inverse write block signal generation circuit WPBC1.
Figure 26B:
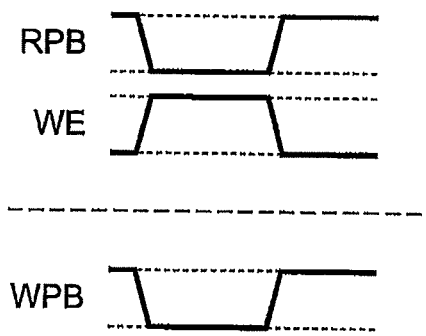
FIG. 26B is a diagram showing an operation waveform of the inverse write block signal generation circuit WPBC1.
Figure 26C:
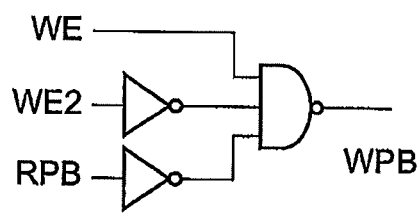
FIG. 26C is a circuit structure diagram of an inverse write block signal generation circuit WPBC2.
Figure 26D:
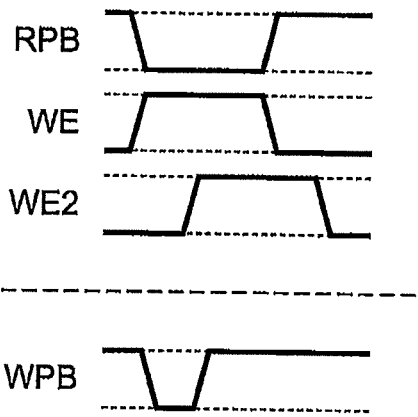
FIG. 26D is a diagram showing an operation waveform of the inverse write block signal generation circuit WPBC2.

Furthermore, FIGS. 24A and 24B show a first source potential generation circuit SLC1 and its operation waveform. FIGS. 25A and 25B show a second source potential generation circuit SLC2 and its operation waveform. FIGS. 26A and 26B show a first generation circuit WPBC1 for an inverse write block signal and its operation waveform. FIGS. 26C and 26D show a second generation circuit WPBC2 and its operation waveform.

Here, the sub-word driver SWD11 will be described in detail with reference to FIG. 21A. The sub-word driver SWD11 is formed by NOR circuits NR11 and NR12. An inverse main word line WLB and an inverse read block signal RPB are inputted to the NOR circuit NR11, which outputs a read word line signal to a read word line RWL. An inverse main word line WLB and an inverse write block signal WPB are inputted to the NOR circuit NR12, which outputs a write word line signal to a write word line WWL.

In a reading operation, a sub-word driver in which both of the inverse main word line WLB and the inverse read block signal RPB are brought into a low level "0" is selected so that the read word line RWL is activated so as to have a high level "1." In a writing operation, a sub-word driver in which all of the inverse main word line WLB, the inverse read block signal RPB, and the inverse write block signal WPB are brought into a low level "0" is selected so that the read word line RWL and the write word line WWL are both activated to have a high level "1." At the time of reading or writing, a row of the memory cell array to which a main word signal and a block signal are inputted is selected and activated so that a reading or writing operation is performed.

Next, the NOR circuit NR12 for generating a write word line signal on the write word line WWL will be described in detail with reference to FIG. 21B. A source, a drain, and a gate of a PMOS transistor P22 are connected to a power source voltage VDD, a source of a transistor P21, and the inverse write block signal WPB, respectively. The source, a drain, and a gate of the PMOS transistor P21 are the drain of the PMOS transistor P22, a drain of a transistor N21, and an inverse main word line WLB, respectively. A source, the drain, and a gate of the NMOS transistor N21 are connected to a ground potential GND, the drain of the transistor P21, and the inverse main word line WLB, respectively. A source, a drain, and a gate of an NMOS transistor N22 are connected to the ground potential GND, the drain of the transistor P21, and the inverse write block signal WPB, respectively.

With such a circuit structure, the write word line WWL is outputted from the source of the PMOS transistor P21 and the sources of the NMOS transistors N21 and N22. When both of the inverse main word line WLB and the inverse write block signal WPB have a low level "0," the PMOS transistors P21 and P22 are in an on-state and the NMOS transistors N21 and N22 are in an off-state. Thus, the write word line WWL as an output of the NOR circuit NR12 outputs a high level "1" of the power source voltage VDD. A memory cell connected to this write word line WWL is selected. When either one of the inverse main word line WLB and the inverse write block signal WPB has a high level "1," the write word line WWL outputs a low level "0" of the ground potential GND.

When FIGS. 21A and 21B, FIGS. 22A and 22B, and FIGS. 23A and 23B are compared with each other, the transistors (P21, P22, N21, and N22) forming an NOR circuit for generating a write word line signal on the write word line WWL and the high potential power sources connected (the power source voltage VDD) are the same in the sub-word drivers SWD11, SWD12, and SWD21, but the low potential power sources connected (GND, VS2, and SL) are different from each other. The NOR circuit NR12 in the sub-word driver SWD11 shown in FIGS. 21A and 21B is connected to a low potential power source outputting the ground potential GND. The NOR circuit NR12-1 in the sub-word driver SWD12 shown in FIGS. 22A and 22B is connected to a low potential power source VS2 outputting a power source voltage that is 0.1 V to 0.2 V higher than the ground potential GND. The NOR circuit NR12-2 in the sub-word driver SWD21 shown in FIGS. 23A and 23B is connected to a low potential power source SL having a variable power source voltage.

In FIG. 22B, the NOR circuit NR12-1 outputs a high level "1" of the power source voltage VDD and a low level "0" of the low potential power source VS2. Other components and operations are the same as those in FIGS. 21A and 21B, and the details thereof are omitted.

In FIG. 23B, the low potential power source SL of the NOR circuit NR12-2 varies its output voltage (source potential) from the ground potential GND to a negative potential VS1 in a writing operation (FIGS. 24A and 24B). Alternatively, the low potential power source SL varies its output voltage (source potential) from a positive potential VS2 to the ground potential GND in a writing operation (FIGS. 25 and 25B).

The source potential generation circuits (low potential power source voltage generation circuits) shown in FIGS. 24A, 24B, 25A, and 25B bring one selected word line in a block selected by the sub-word driver circuit into a high level "1" in a writing operation but reduce a low level "0" in the selected block to a lower potential. By applying such a low level "0" output to the gate of the access transistor N4 (FIG. 7) in the SRAM cell, it is possible to reduce a leakage current of the access transistor N4 and prevent erroneous writing.

The first source potential generation circuit SLC1 shown in FIG. 24A usually outputs the ground potential GND as a low level "0" but outputs a low level "0" reduced to a negative potential VS1 for a selected block in a writing operation as shown in FIG. 24B.

The source potential generation circuit SLC1 is formed by an NOR circuit NR21 to which the inverse write block signal WPB and the inverse write enable signal WEB are inputted, an inverter circuit W21 to which an output of the NOR circuit NR21 is inputted, a transistor N23, and a transistor N24. A drain, a source, and a gate of the transistor N23 are connected to the low potential power source SL (FIG. 23B), a negative potential VS1, and the output of the NOR circuit NR21, respectively. A drain, a source, a gate of the transistor N24 are connected to the low potential power source SL (FIG. 23B), the ground potential GND, and the inverter circuit W21, respectively.

When the inverse write block signal WPB or the inverse write enable signal WEB has a high level "1," the NOR circuit NR21 is brought into a low level. Thus, the transistor 24 is turned on, whereas the transistor 23 is turned off. Accordingly, the source potential generation circuit SLC1 outputs the ground potential GND. When the inverse write block signal WPB and the inverse write enable signal WEB have a low level "0," the NOR circuit NR21 outputs a high level "1." Thus, the transistor 24 is turned off, whereas the transistor 23 is turned on. Accordingly, the source potential generation circuit SLC1 outputs the negative potential VS1.

When the memory cell is not accessed, the source potential generation circuit SLC1 outputs the ground potential GND as the low potential power source SL. Here, a corresponding block is selected, and both of the inverse write enable signal WEB and the inverse write block signal WPB are changed into a low level "0." This means that one word line is selected in the same block during a writing cycle. At that time, the negative potential VS1 is outputted as a low potential power source to the write word line of the selected block. A high level "1" is outputted to the selected write word line in the selected block, whereas the negative potential VS1 is outputted as a low level "0" to the non-selected write word line in the selected block.

The second source potential generation circuit SLC2 shown in FIG. 25A usually outputs the positive potential VS2 as a low level "0" but outputs a low level "0" reduced to the ground potential GND for a selected block in a writing operation as shown in FIG. 25B.

The source potential generation circuit SLC2 differs from the source potential generation circuit SLC1 in connection of the sources of the transistor N23 and the transistor N24. The source of the transistor N23 is connected to the ground potential GND, and the source of the transistor N24 is connected to the low potential power source VS2. Other components are the same. Accordingly, the source potential generation circuit SLC2 outputs the ground potential GND as the low potential power source SL when both of the inverse write block signal WPB and the inverse write enable signal WEB have a low level "0" and outputs the low power source voltage VS2 as the low potential power source SL when both of the inverse write block signal WPB and the inverse write enable signal WEB have other input levels.

With the aforementioned source potential generation circuits (low potential power source voltage generation circuits) SLC1 and SLC2, a low level "0" of the write word line WWL for a selected block can be reduced to a voltage value lower than a usual level in a writing operation. By using a sub-word driver employing such a source potential generation circuit, it is possible to prevent erroneous writing to a memory cell.

Next, a generation circuit for the inverse write block signal WPB will be described in detail with reference to FIGS. 26A to 26D.

In FIG. 26A, a first inverse write block signal generation circuit WPBC1 generates the inverse write block signal WPB. The first inverse write block signal generation circuit WPBC1 is a circuit for generating an inverse write block signal WPB of a low level for a selected block during a writing cycle. The first inverse write block signal generation circuit WPBC1 is formed by a NAND circuit to which an inverse signal of the inverse read block signal RPB and the write enable signal WE are inputted. As shown in FIG. 26B, when the inverse read block signal RPB has a low level "0" and the write enable signal WE has a high level "1," then the inverse write block signal WPB outputs a low level. The inverse write block signal WPB outputs a high level for other logic inputs.

In FIG. 26C, a second inverse write block signal generation circuit WPBC2 is a circuit for generating an inverse write block signal WPB of a one-shot low level only at an initial stage of a writing period. As compared to WPBC1 shown in FIG. 26A, an inverse signal of a delay write enable signal WE2, which is generated by delaying the write enable signal, is additionally inputted a NAND circuit. The delay write enable signal is a signal generated by delaying the write enable signal WE by a period of time corresponding to the width of a desired one-shot pulse. As shown in FIG. 26D, when the inverse read block signal RPB has a low level "0," the write enable signal WE has a high level "1," and the delay write enable signal WE2 has a low level "0," then the inverse write block signal WPB outputs a low level. The inverse write block signal WPB outputs a high level for other logic inputs. Accordingly, a one-shot pulse is generated so that a low level is held only for the delay time between the write enable signal WE and the delay write enable signal WE2.

With the inverse write block generation circuits shown in FIGS. 26A and 26C, an inverse write block signal for a selected block can be obtained from a write enable signal and an inverse read block signal. Furthermore, an inverse write block signal of a one-shot pulse can be obtained by inputting a delayed write enable signal.

(Embodiment 6)

An example of a semiconductor memory device in which the sense amplifiers and the sub-word drivers are combined with the SRAM cell 1 in the first embodiment will be described in Embodiment 6 of the present invention with reference to FIGS. 27 to 33D. However, semiconductor memory devices in which the sense amplifiers and the sub-word drivers are applicable to the SRAM cell are not limited to the semiconductor memory device in the present invention. As a matter of course, those may be combined with and applied to various types of semiconductor memory devices.

Figure 27:
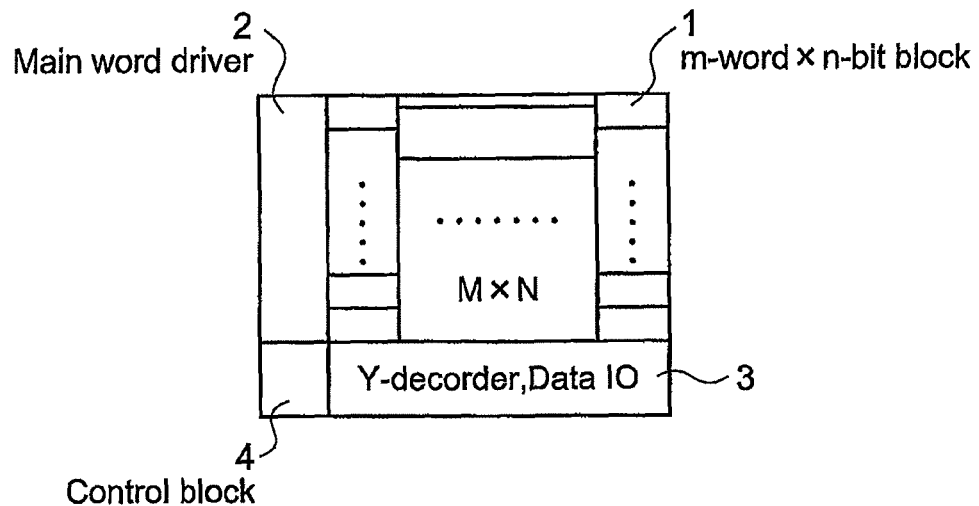
FIG. 27 is a general view of a semiconductor memory device according to the present invention.

FIG. 27 shows a main configuration of a semiconductor memory device. The semiconductor memory device is formed by a main word driver 2, a Y-decoder and data input/output part 3, and a control circuit 4, which are disposed around a memory array in which memory blocks 1 each having (m-word)×(n-bit) configuration are arranged with M rows and N columns.

Figure 28:
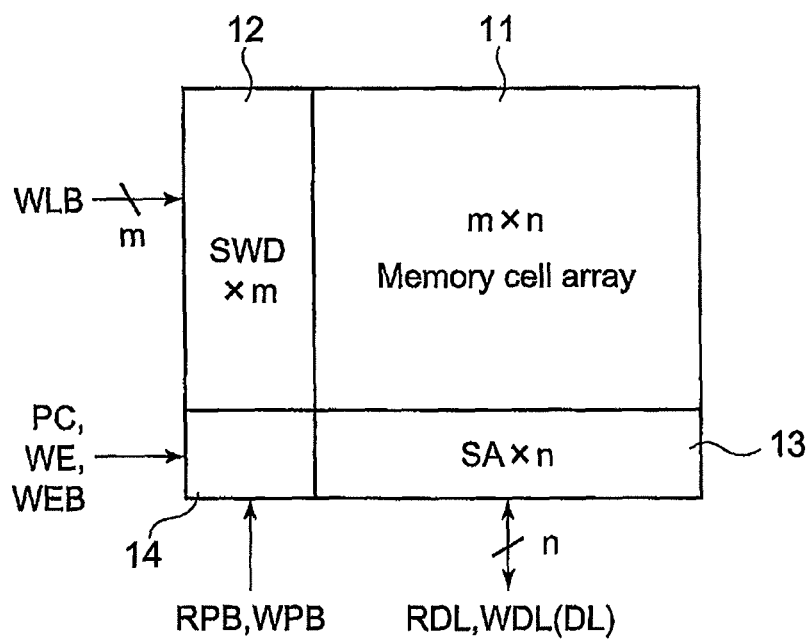
FIG. 28 is a diagram showing a configuration example of a memory block 1 in the semiconductor memory device.

FIG. 28 shows a configuration example of the memory block 1 shown in FIG. 27. The memory block 1 is formed by sub-word drivers 12, sense amplifiers 13, and a control part 14, which are disposed around a memory cell array 11 having (m-word)×(n-bit) configuration. The sub-word driver 12 selects one word line of the memory cell array 11 with using an inverse main word line WLB inputted from the main word driver 2, an inverse read block signal RPB, and an inverse write block signal WPB. The sense amplifier 13 amplifies a signal of a bit line connected to the memory cell array 11 and transmits it to a data line of the Y-decoder and data input/output part 3 in a reading operation. Conversely, the sense amplifier 13 writes a signal from the data line into the memory cell array in a writing operation. The control part 14 includes therein a wiring portion for a pre-charge signal PC, a write enable signal WE, an inverse write enable signal WEB, the inverse read block signal RPB, and the inverse write block signal WPB or an amplifier circuit for control signals thereof. Furthermore, when the inverse write block signal generation circuit WPBC1 is disposed in the control part 14 so that an inverse write block signal WPB is generated within the control part 14, it is possible to omit a write block signal WPB outputted from the Y-decoder and data input/output part 3 and inputted to the control part 14.

Figure 29:
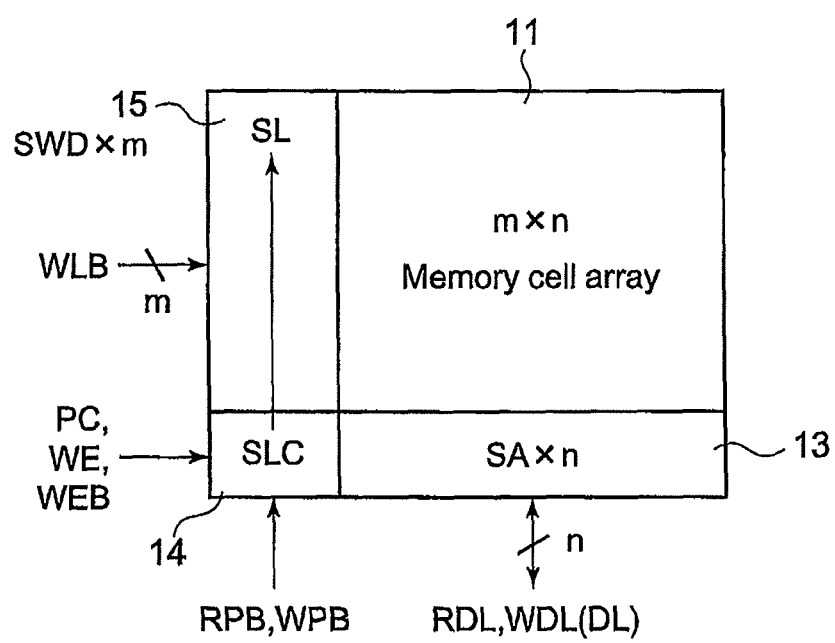
FIG. 29 is a diagram showing another configuration example of the memory block 1 in the semiconductor memory device.

FIG. 29 shows another configuration example of the memory block 1 shown in FIG. 27, in which generation circuits SLC for a low potential power source SL for sub-word drivers are disposed in a control part 14. Other components are the same as those in FIG. 28. In the case of FIG. 28, an operation cycle is shorter than a retention time so that no erroneous writing is caused, and a ground potential GND or a low potential power source VS2 having a constant level is applied as a low level "0" to the sub-word drivers. In the case of FIG. 29, an operation cycle is longer than a retention time so that erroneous writing may be caused, and the source potential generation circuits are used because the potential of a non-selected word line in a selected block should be changed to a lower voltage for a low level "0" of the sub-word drivers in a writing operation.

Now, it is assumed that the access transistor N4 of the SRAM cell 1 is a low threshold voltage transistor, that a retention time of the storage node V2 in the SRAM cell 1 is longer than a writing time even if a low level from the sub-word driver has a ground potential, and that no erroneous writing is caused in a non-selected cell in a writing operation. In this case, a semiconductor memory device in which the SRAM cells 1, the sub-word drivers SWD11, and the sense amplifiers SA11 or SA12 are combined with each other is used as the memory cell in the configuration shown in FIG. 28.

FIGS. 30A to 30D show operation waveforms of (a) "0" reading operation, (b) "1" reading operation, (c) "0" writing operation, and (d) "1" writing operation in a memory cell of a semiconductor memory device in which the SRAM cells 1, the sub-word drivers SWD11, and the sense amplifiers SA11 or SA12 are combined with each other as described above. Here, the sense amplifier SA11 has only one line of the data line DL, whereas the sense amplifier SA12 has separated lines of the read data line RDL and the write data line WDL. Accordingly, for the sense amplifier SA12, the data line DL can be read as RDL in the reading operations and as WDL in the writing operations.

Figures 30A, 30B:
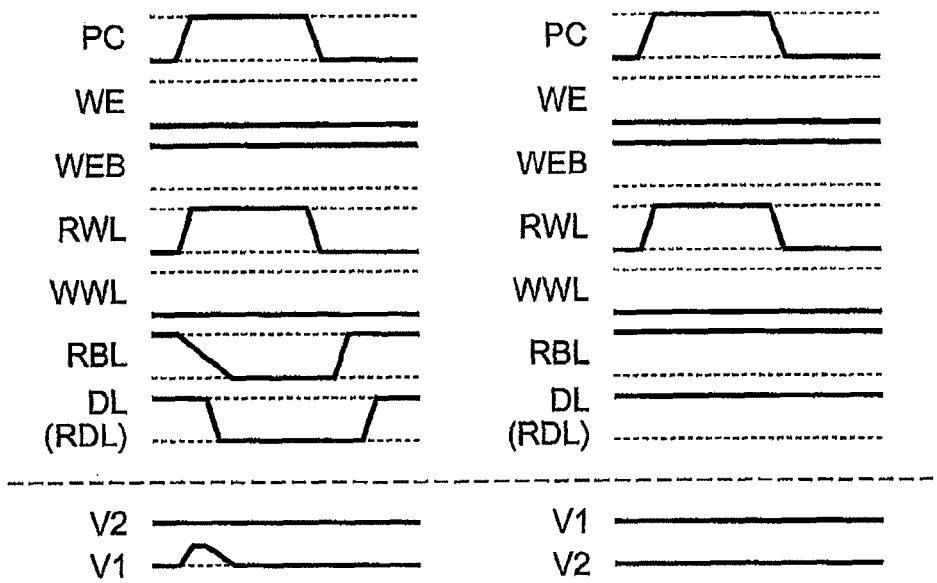
FIG. 30A is a chart explanatory of an operation ("0" reading) in an example of the configuration shown in FIG. 28.
FIG. 30B is a chart explanatory of an operation ("1" reading) in the configuration shown in FIG. 28.

FIGS. 30A and 30B show waveforms of the "0" and "1" reading operations. The pre-charge signal PC is brought into a high level so that a pre-charge operation is completed. The read word line RWL is brought into a high level so as to bring the access transistor N3 into conduction. The stored data "0" or "1" of the storage node V1 in the memory cell are read into the read bit line RBL, amplified by the sense amplifier, and transmitted to the data line. Thus, a reading operation is performed. At that time, signals for writing do not change. These operations are the same as the operations of the sense amplifiers SA11 and SA12 (the same as those in FIGS. 17A to 17D).

Figures 30C, 30D:
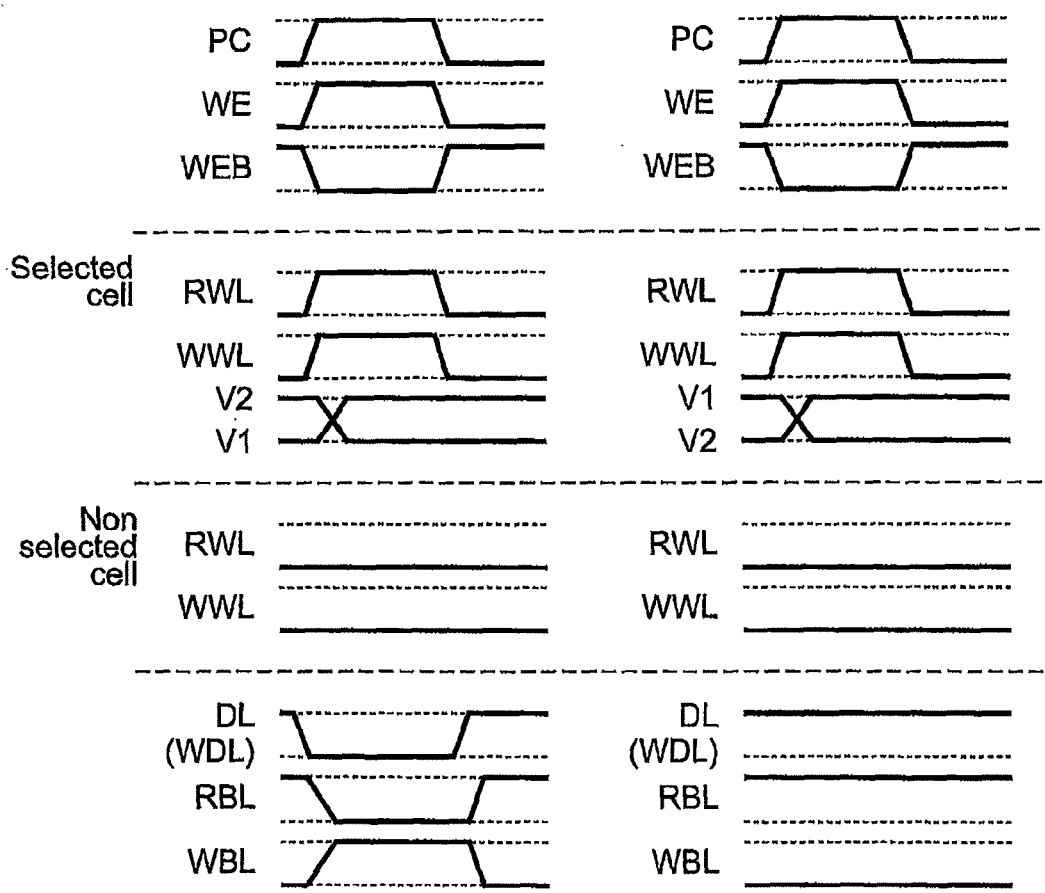
FIG. 30C is a chart explanatory of an operation ("0" writing) in the configuration shown in FIG. 28.
FIG. 30D is a chart explanatory of an operation ("1" writing) in the configuration shown in FIG. 28.

FIGS. 30C and 30D show waveforms of the "0" and "1" writing operations. FIGS. 30C and 30D illustrate waveforms both for a selected cell in which a word line has been selected and for a non-selected cell that has not been selected. Those operation waveforms are the same as in the operations of the sense amplifiers SA11 and SA12 and are the same as those in FIGS. 17A to 17D. Accordingly, the details of those operation waveforms are omitted.

Next, it is assumed that the access transistor N4 of the SRAM cell 1 is a normal threshold voltage transistor, that a retention time of the storage node V2 in the SRAM cell 1 is longer than a writing time even if a low level from the sub-word driver has a low potential power source, and that no erroneous writing is caused in a non-selected cell in a writing operation. In this case, a semiconductor memory device in which the SRAM cells 1, the sub-word drivers SWD12, and the sense amplifiers SA11 or SA12 are combined with each other is used as the memory cell in the configuration shown in FIG. 28.

FIGS. 31A to 31D show operation waveforms of (a) "0" reading operation, (b) "1" reading operation, (c) "0" writing operation, and (d) "1" writing operation in a memory cell of a semiconductor memory device in which the SRAM cells 1, the sub-word drivers SWD12, and the sense amplifiers SA11 or SA12 are combined with each other. This configuration differs from the components of the semiconductor memory device exhibiting the operation waveforms shown in FIGS. 30A to 30D only in that the sub-word drivers SWD11 are changed to SWD12. Accordingly, the low level of the write word line WWL is only changed to the low potential power source VS2 in the sub-word driver SWD12. Other operation waveforms are the same as in FIGS. 30A to 30D, and the details of the operation waveforms are omitted.

Next, it is assumed that the access transistor N4 of the SRAM cell 1 is a low threshold voltage transistor, that a retention time of the storage node V2 in the SRAM cell 1 is shorter than a writing time even if a low level from the sub-word driver has a ground potential GND, and that erroneous writing is caused in a non-selected cell in a writing operation. In this case, a semiconductor memory device in which the SRAM cells 1, the sub-word drivers SWD21, the sense amplifiers SA11 or SA12, and the source potential generation circuits SLC1 are combined with each other is obtained as the memory cell in the configuration shown in FIG. 29.

FIGS. 32A to 32D show operation waveforms of (a) "0" reading operation, (b) "1" reading operation, (c) "0" writing operation, and (d) "1" writing operation in a memory cell of a semiconductor memory device in which the SRAM cells 1, the sub-word drivers SWD21, the sense amplifiers SA11 or SA12, and the source potential generation circuits SLC1 are combined with each other as described above. This configuration differs from the components of the semiconductor memory device exhibiting the operation waveforms shown in FIGS. 30A to 30D in that the sub-word drivers SWD11 are changed to SWD21. Accordingly, the low level of the write word line WWL from the sub-word driver SWD21 is lowered from the ground potential GND to the negative potential VS1 for a non-selected cell only during a writing cycle. Other operation waveforms are the same as in FIGS. 30A to 30D, and the details of the operation waveforms are omitted.

As another combination of components, it is assumed that the access transistor N4 of the SRAM cell 1 is a normal threshold voltage transistor and that a low level from the sub-word driver corresponds to a low potential power source. At that time, it is assumed that a retention time of the storage node V2 in the SRAM cell 1 is shorter than a writing time and that erroneous writing is caused in a non-selected cell in a writing operation. In this case, a semiconductor memory device in which the SRAM cells 1, the sub-word drivers SWD21, the sense amplifiers SA11 or SA12, and the source potential generation circuits SLC2 are combined with each other is obtained as the memory cell in the configuration shown in FIG. 29.

FIGS. 33A to 33D show operation waveforms of (a) "0" reading operation, (b) "1" reading operation, (c) "0" writing operation, and (d) "1" writing operation in a memory cell of a semiconductor memory device in which the SRAM cells 1, the sub-word drivers SWD21, the sense amplifiers SA11 or SA12, and the source potential generation circuits SLC2 are combined with each other. This configuration differs from the components of the semiconductor memory device exhibiting the operation waveforms shown in FIGS. 31A to 31D in that the source potential generation circuits SLC1 is changed to the source potential generation circuits SLC2. Accordingly, the low level of the write word line WWL from the sub-word driver SWD21 is lowered from the low potential power source VS2 to the ground potential GND for a non-selected cell only during a writing cycle. Other operation waveforms are the same as in FIGS. 31A to 31D, and the details of the operation waveforms are omitted.

In the present embodiment, by combining the memory cell 1 with the sense amplifiers and the sub-word driver circuits, it is possible to obtain a semiconductor memory device capable of preventing data corruption in a reading operation and erroneous writing in a writing operation and operating at a high speed with a minimum number of transistors.

(Embodiment 7)

An example of a semiconductor memory device in which the sense amplifiers and the sub-word drivers are combined with the SRAM cell 2 in the second embodiment will be described in Embodiment 7 of the present invention with reference to FIGS. 34 to 37D. However, semiconductor memory devices in which the sense amplifiers and the sub-word drivers are applicable to the SRAM cell 2 are not limited to the semiconductor memory device in the present invention. As a matter of course, those may be combined with and applied to various types of semiconductor memory devices. The write word line WWL to the SRAM cell 2 has a one-shot pulse activated only at an initial stage of a writing cycle. The generation circuits WPBC2 are used for the inverse write block signal WPB.

Figure 34:
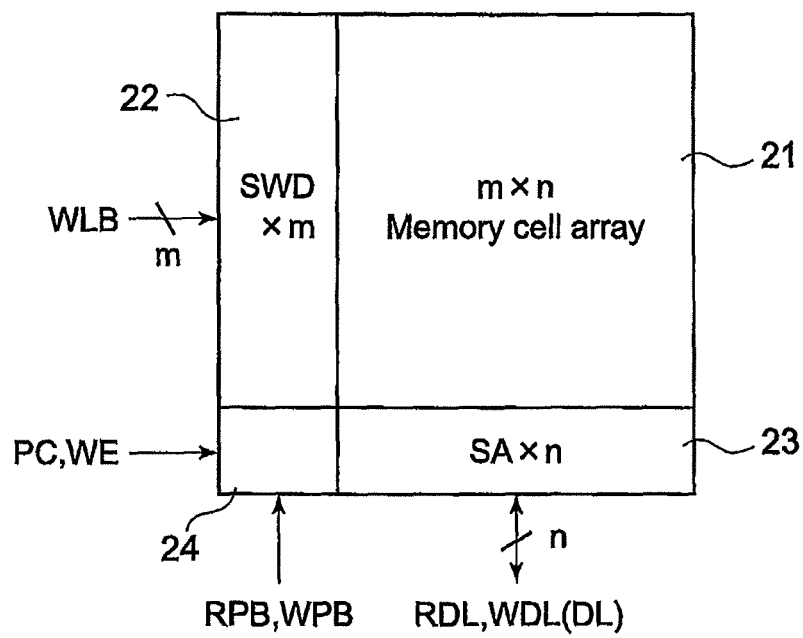
FIG. 34 is a diagram showing a specific example of the memory block 1 in the semiconductor memory device.

The entire configuration of this semiconductor memory device is the same as that in the FIG. 27. FIG. 34 shows a specific example of the memory block 1 shown in FIG. 27. The memory block 1 is formed by sub-word drivers 22, sense amplifiers 23, and a control part 24, which are disposed around a memory cell array 21 having (m-word)×(n-bit) configuration. The sub-word driver 22 selects one word line of the memory cell array 21 with using an inverse main word line WLB inputted from the main word driver 2, an inverse read block signal RPB, and an inverse write block signal WPB. The sense amplifier 23 amplifies a signal of a bit line connected to the memory cell array 21 and transmits it to a data line of the Y-decoder and data input/output part 3 in a reading operation. Conversely, the sense amplifier 23 writes a signal from the data line into the memory cell array in a writing operation. The control part 24 includes therein a wiring portion for control signals or an amplifier circuit for control signals.

Figure 35:
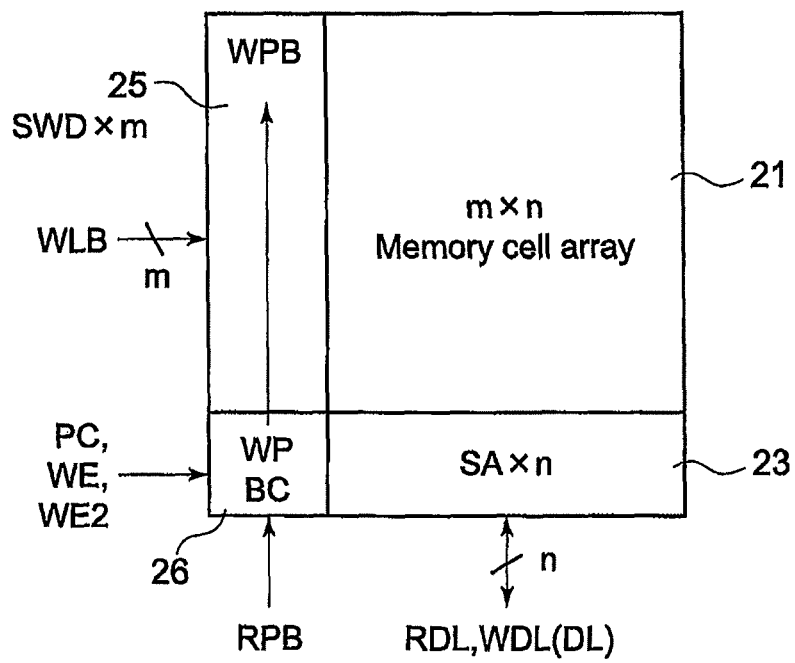
FIG. 35 is a diagram showing another specific example of the memory block 1 in the semiconductor memory device.
Figures 37A, 37B:
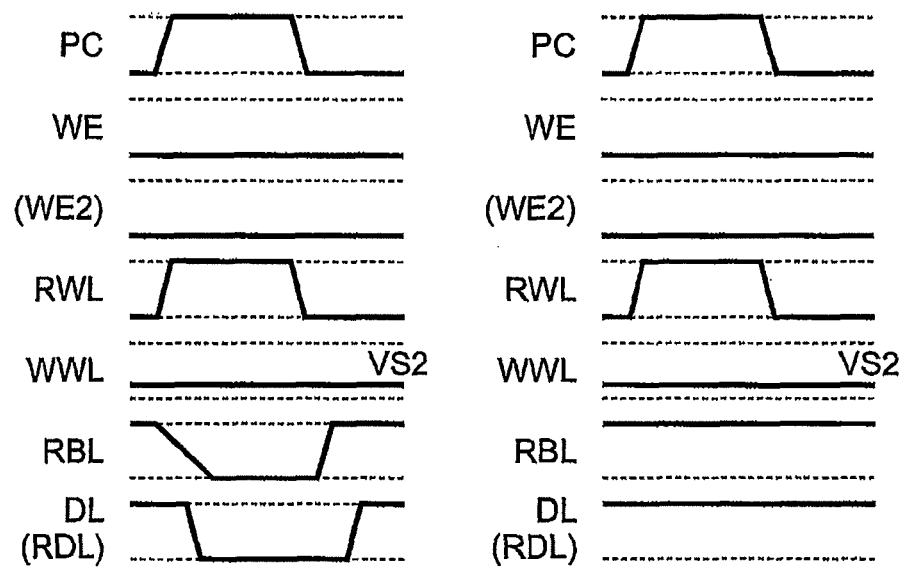
FIG. 37A is a chart explanatory of an operation ("0" reading) in the configuration shown in FIG. 35.
FIG. 37B is a chart explanatory of an operation ("1" reading) in the configuration shown in FIG. 35.
Figures 37C, 37D:
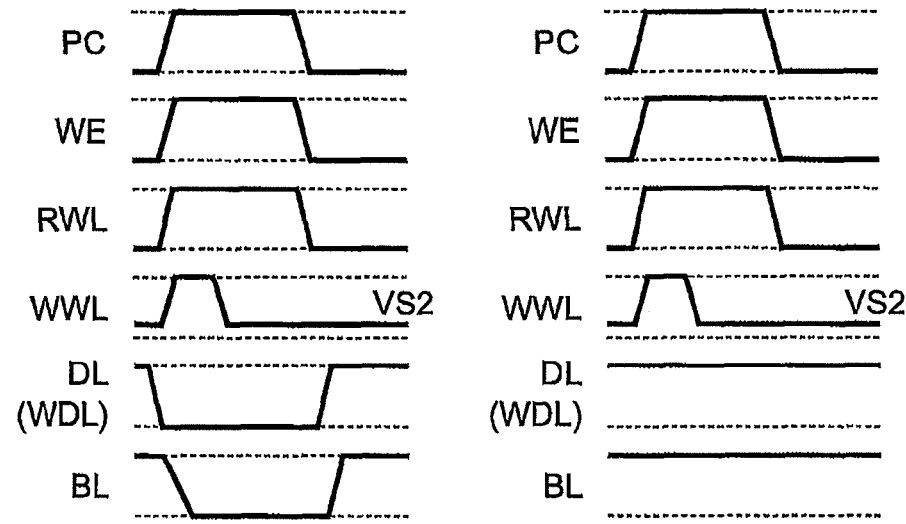
FIG. 37C is a chart explanatory of an operation ("0" writing) in the configuration shown in FIG. 35.
FIG. 37D is a chart explanatory of an operation ("1" writing) in the configuration shown in FIG. 35.

FIG. 35 shows another specific example of the memory block 1 shown in FIG. 27, in which inverse write block signal generation circuits WPBC2 are disposed in a control part 24. Since an inverse write block signal WPB is generated in the control part 24, it is possible to reduce a drive capacity of the generation circuits and shorten a delay time of the inverse write block signal WPB. The inverse write block signal generation circuit WPBC2 is a circuit for generating an inverse write block signal WPB of a one-shot low level at an initial stage of a writing cycle. The write enable signal WE, the delay write enable signal WE2, and the inverse read block signal RPB are inputted to the inverse write block signal generation circuits WPBC2, and an inverse write block signal WPB is generated by the inverse write block signal generation circuits WPBC2.

In the SRAM cell 2, the source terminal of the access transistor N4 is continuously connected to the ground potential GND, and no erroneous writing to a non-selected cell is caused in a writing operation. Accordingly, a source potential generation circuit for the SRAM cell 1 is not needed. A constant level of the ground potential GND or the low potential power source VS2 is applied as a low level "0" of the sub-word drivers.

FIGS. 36A to 36D show operation waveforms in a semiconductor memory device in which the SRAM cells 2 having an access transistor N4 of a low threshold voltage transistor, the sub-word drivers SWD11 outputting a ground potential GND as a low level, and the sense amplifiers SA21 or SA22 are combined with each other. FIG. 36A shows "0" reading operation, FIG. 36B "1" shows reading operation, FIG. 36C "0" writing operation, and FIG. 36D shows "1" writing operation.

FIGS. 36A and 36B show waveforms of the "0" and "1" reading operations. The pre-charge signal PC is brought into a high level so that a pre-charge operation is completed. The read word line RWL is brought into a high level so as to bring the access transistor N3 into conduction. The stored data "0" or "1" of the storage node V1 in the memory cell are read into the read bit line RBL, amplified by the sense amplifier, and transmitted to the data line DL (or the read data line RDL). Thus, a reading operation is performed. At that time, signals for writing do not change. These operations are the same as the operations of the sense amplifiers SA11 and SA12 (the same as those in FIGS. 17A to 17D).

In the case of the "0" writing operation shown in FIG. 36C, the pre-charge signal PC and the write enable signal WE are brought into a high level so as to stop a pre-charge operation. The read word line RWL and the write word line are brought into a high level, so that data "0" from the data line DL (or the write data line WDL) are written into the storage node V1. The storage node V2 is brought into an intermediate point by conduction of the load transistor P2 and the access transistor N4. The one-shot pulse of the write word line WWL is changed into a low level, so that a high level "1" is written into the storage node V2 by the load transistor P2. The read word line RWL, the write enable signal WE, and the pre-charge signal PC are brought into a low level, and a writing cycle is completed.

In the case of the "1" writing operation shown in FIG. 36D, the pre-charge signal PC and the write enable signal WE are brought into a high level so as to stop a pre-charge operation. The read word line RWL and the write word line are brought into a high level, so that data "1" from the data line DL (or the write data line WDL) are written into the storage node V1. Data "0" are written into the storage node V2 by conduction of the access transistor N4. The one-shot pulse of the write word line WWL is changed into a low level, and the read word line RWL, the write enable signal WE, and the pre-charge signal PC are brought into a low level. Thus, a writing cycle is completed.

FIGS. 37A to 37D show operation waveforms in a semiconductor memory device in which the SRAM cells 2 having an access transistor N4 of a normal threshold voltage transistor, the sub-word drivers SWD12 outputting a low potential power source VS2 as a low level, and the sense amplifiers SA21 or SA22 are combined with each other. FIG. 36A shows "0" reading operation, FIG. 36B shows "1" reading operation, FIG. 36C shows "0" writing operation, and FIG. 36D shows "1" writing operation.

FIGS. 37A to 37D differ from FIGS. 36A to 36D only in that the low level "0" of the write word line WWL is a low potential power source VS2. Other operations are the same as in FIGS. 36A to 36D. The details of those operations are omitted.

In the present embodiment, by combining the memory cell 1 with the sense amplifiers and the sub-word driver circuits, it is possible to obtain a semiconductor memory device capable of preventing data corruption in a reading operation and erroneous writing in a writing operation and operating at a high speed with a minimum number of transistors.

Although the present invention has been described in detail based on the embodiments, it is not limited to the aforementioned embodiments. As a matter of course, it should be understood that various changes may be made therein without departing from the scope of the present invention.

The invention claimed is:

1. A semiconductor memory device comprising:
a read word line;
a write word line; and
a sub-word driver operable to select said read word line using a main word signal and an inverse read block signal and select said write word line using said main word signal and an inverse write block signal, said sub-word driver having a first inverter circuit using said main word signal as an input and outputting said read word line, a first transistor having a drain, a source, and a gate connected to said read word line, a low potential power source, and said inverse write block signal, respectively, and a second transistor having a drain, a source, and a gate connected to a power source terminal of said first inverter circuit, a power source, and said inverse write block signal, respectively, and is operable to select said write word line.

2. The semiconductor memory device as recited in claim 1, wherein said low potential power source is set to be a first low level potential for a non-selected block and a second low level potential lower than said first low level potential for a selected block during a writing cycle.

3. The semiconductor memory device as recited in claim 1, wherein said inverse write block signal is generated from a write enable signal and said inverse read block signal.

4. The semiconductor memory device as recited in claim 1, wherein said inverse write block signal is generated from a write enable signal, an inverse signal of a delay write enable signal generated by delaying said write enable signal, and said read block signal.

* * * * *